United States Patent [19]
Koo

[11] 3,964,030
[45] June 15, 1976

[54] SEMICONDUCTOR MEMORY ARRAY

[75] Inventor: James Teh-Zen Koo, Wescosville, Pa.

[73] Assignee: Bell Telephone Laboratories, Incorporated, Murray Hill, N.J.

[22] Filed: Oct. 29, 1974

[21] Appl. No.: 518,636

Related U.S. Application Data

[63] Continuation of Ser. No. 423,295, Dec. 10, 1973, abandoned.

[52] U.S. Cl. .................... 340/173 R; 340/172.5
[51] Int. Cl.² ................ G11C 13/00; G11C 11/40
[58] Field of Search ............... 340/172.5, 173 R

[56] References Cited
UNITED STATES PATENTS

| | | | |
|---|---|---|---|
| 3,599,180 | 8/1971 | Rubinstein | 340/173 R |
| 3,778,784 | 12/1973 | Karp | 340/173 R |
| 3,778,784 | 12/1973 | Karp | 307/279 |
| 3,832,699 | 8/1974 | Matsue | 340/173 R |
| 3,855,483 | 12/1974 | Karp | 340/173 R |
| 3,855,483 | 12/1974 | Karp | 307/279 |

FOREIGN PATENTS OR APPLICATIONS

| | | | |
|---|---|---|---|
| 2,324,769 | 5/1972 | Germany | 340/173 R |

OTHER PUBLICATIONS

A 4K MOS Dynamic Random–Access Memory, by Robert Abbott et al., IEEE Journal of Solid State Circuits, vol. SC-8, No. 5, Oct. 1973, pp. 292–298.

*Primary Examiner*—Terrell W. Fears
*Attorney, Agent, or Firm*—I. Ostroff

[57] ABSTRACT

A 1,024 bit semiconductor memory system, fabricated on a single integrated circuit chip, utilizes dynamic memory cells and low power dynamic control circuitry. An initial input control signal activates the control circuitry which internally generates all the control signals. The timing of all the internally generated control signals is automatically maintained by the control circuits.

8 Claims, 22 Drawing Figures

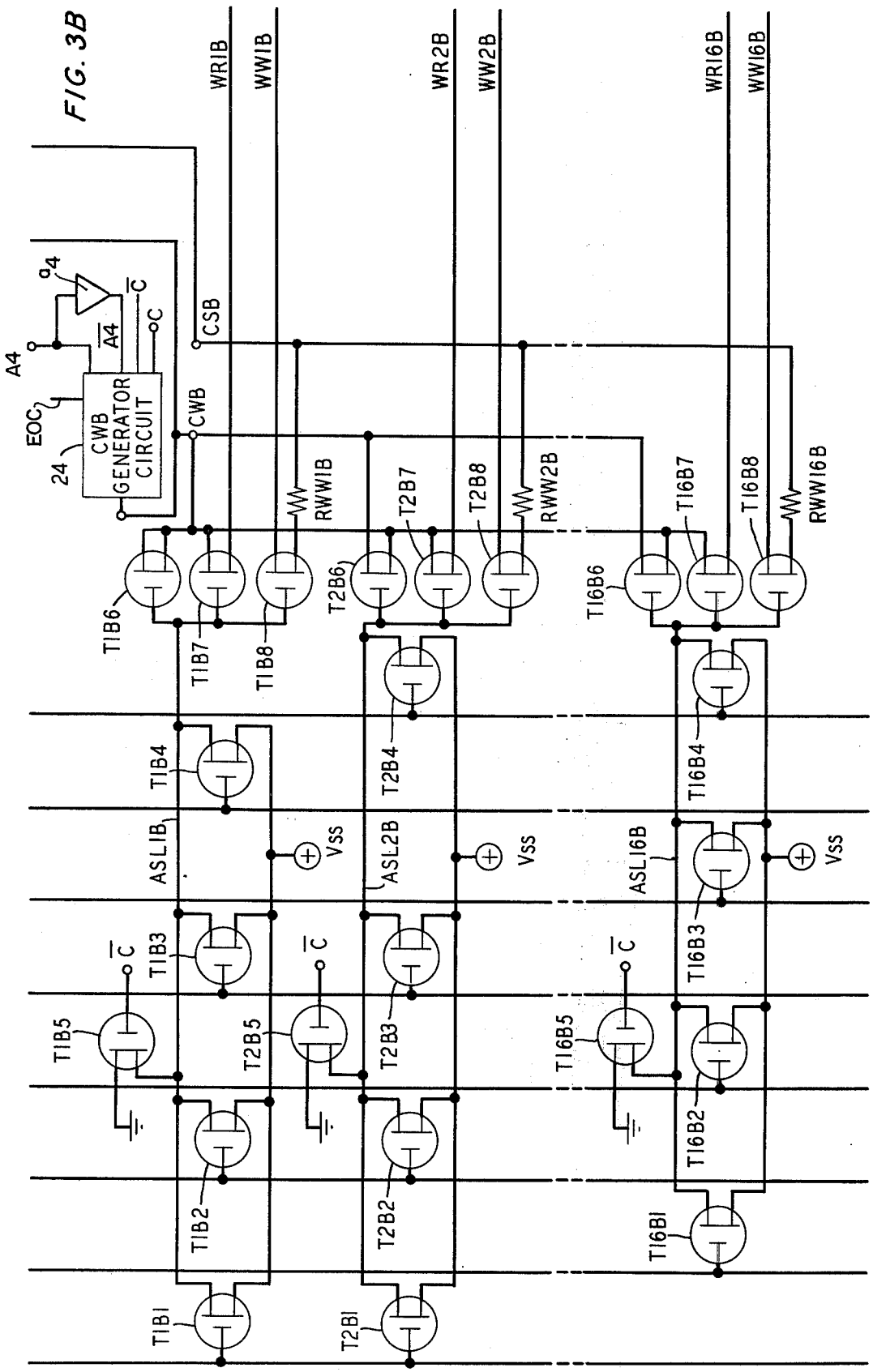

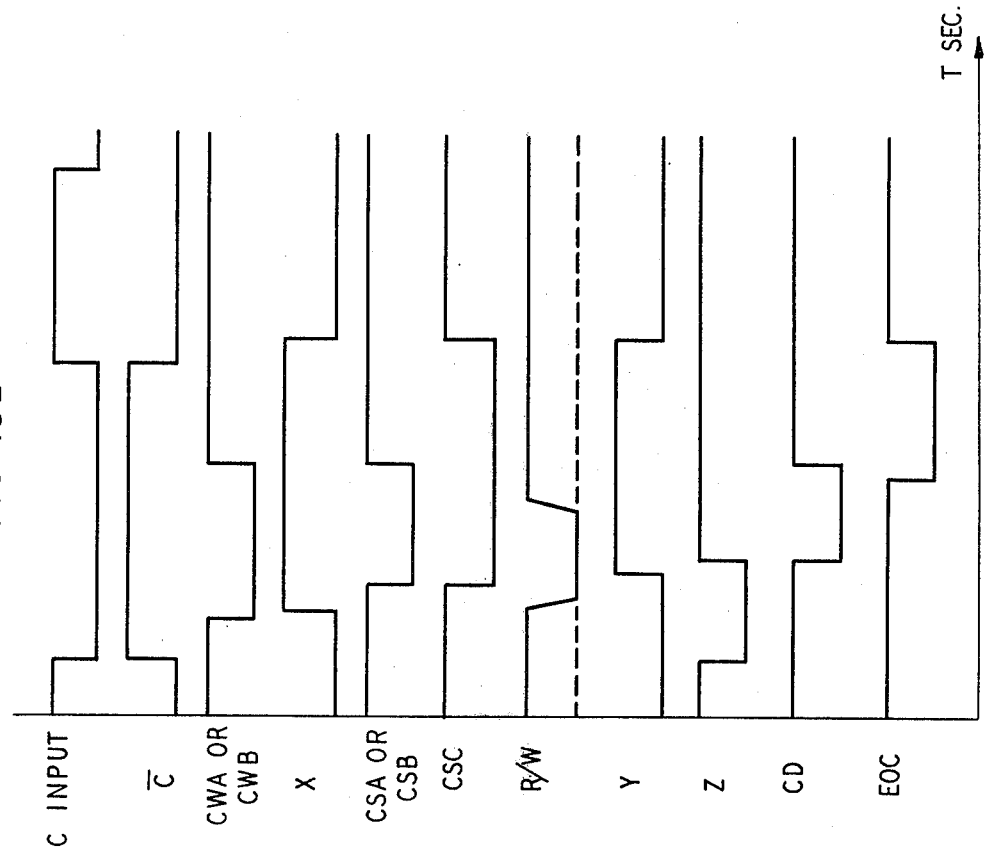
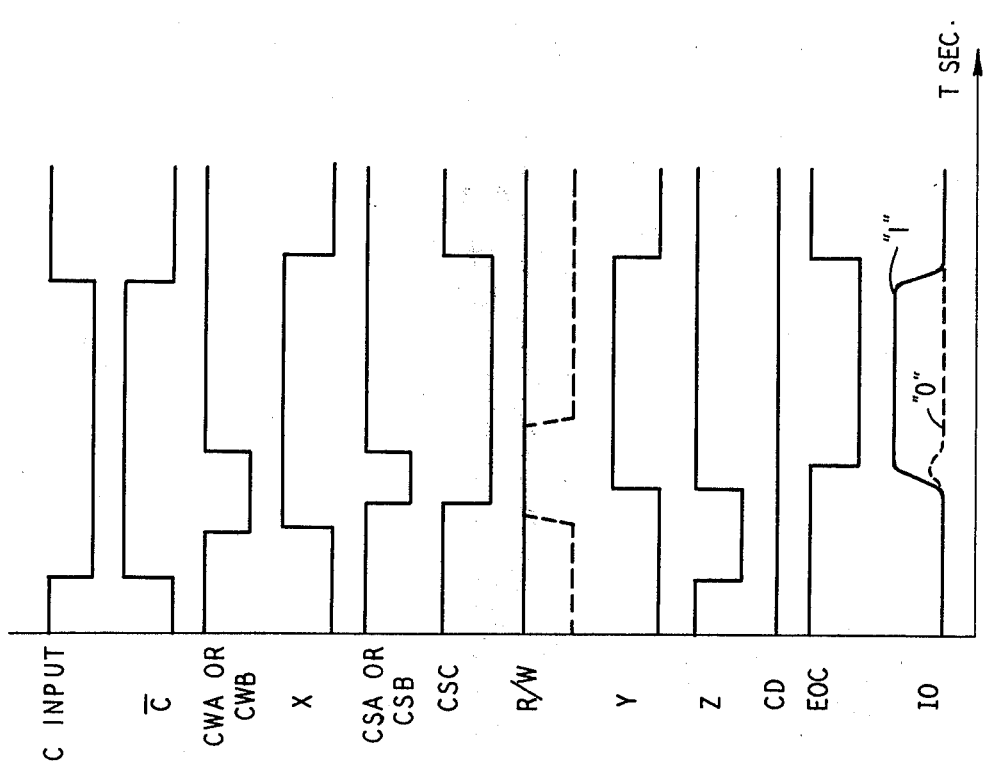

SEMICONDUCTOR MEMORY ARRAY

This is a continuation of application Ser. No. 423,295, filed Dec. 10, 1973, now abandoned.

BACKGROUND OF THE INVENTION

This invention relates to semiconductor memory array systems and more particularly to semiconductor array systems utilizing dynamic memory cells and dynamic control circuitry.

In computer and related apparatus there exists a need for relatively large information capacity semiconductor memories in which logic information can be temporarily stored and then retrieved within a useful period of time. These memories must be capable of relatively high speed operation and have relative low power dissipation. To economically meet such requirements it is necessary that the basic memory cell be a sufficiently simple structure which consumes relatively little power in order to permit a relatively large number to be fabricated and interconnected on a single monolithic integrated circuit chip. In addition, the control circuitry utilized should consume as little power as possible and should not require voltage pulse inputs which must be critically timed.

An integrated circuit manufactured by Intel, which is denoted as the 1103, employs a three-transistor dynamic memory cell that serves as the basic cell for a 1,024 bit random access memory, which is fabricated on a single monolithic integrated circuit chip. This circuit typically has an access time of from 150 to 300 nanoseconds, a cycle time of from 250 to 580 nanoseconds and power dissipation during the active cycle of from 300 to 500 milliwatts. While this circuit has many advantages, one of the major disadvantages is that it requires multiple complex input signals which must be critically synchronized. An improved version of the 1103, known as the 1103A, simplifies the timing requirement on the input signals, however, power consumption of the control circuitry is still relatively high and the timing requirements are still relatively strict.

It would be very desirable to today have a memory system which utilizes dynamic memory cells but in which the power dissipation of the associated control circuitry is significantly reduced and the timing requirements are significantly eased.

OBJECTS OF THE INVENTION

It is an object of this invention to provide a dynamic memory system on a single monolithic integrated circuit chip which has relatively high speed and low power dissipation and which does not require stringent timing of applied pulses.

SUMMARY OF THE INVENTION

This and other objects of the invention are attained in an illustrative embodiment of the invention comprising a 1,024 bit dynamic memory system comprising dynamic memory cells and low power dynamic control circuitry. In the preferred embodiment the system comprises two array of memory cells, each of which comprises 16 rows and 32 columns of interconnected memory cells. In the preferred embodiment each memory cell comprises three insulated gate field effect transistors (IGFETs) and has four terminals. The drain of the first transistor is coupled to the gate of the second transistor. The source of the first transistor serves as the input line. The gate of the first transistor is a control terminal which enables the first transistor such that information on the source of the first transistor can be transferred onto the capacitance associated with the drain of the first transistor and the gate of the second transistor. This capacitance is charged to one of two potential levels which represent a stored 1 and a stored 0, respectively. The drain of the second transistor is coupled to the source of the third transistor. The gate of the third transistor acts as control terminal which allows or inhibits current flow through the second and third transistors. The drain of the third transistor serves as the cell output terminal. If a 1 is stored in cell and the third transistor is enabled there is conduction through the second and third transistors. If a 0 is stored in the cell there is no conduction.

Dynamic horizontal address circuitry comprising 32 rows of four IGFETs per row is utilized to select one of the 16 rows of either of the two memory arrays. Dynamic vertical address circuitry comprising 32 columns of five IFGETs per column is utilized to select one of the 32 columns.

One input signal to the memory system is used to trigger CWA or CWB generator circuits. The outputs of both generator circuits are coupled appropriately to the horizontal address circuitry. The outputs cause only one word read line of a row of memory cells of the A or B memory array to be discharged from an initial 0 level potential to a 1 level potential. The discharge of the selected word read line enables information stored in the memory cells coupled to the selected word read line to be read out onto a bit read line. Circuitry coupled to the word read lines detects changes in potential of a word read line and creates an output signal which is coupled to CSA and CSB generator circuits. The CSA and CSB circuits, which are triggered by the received signal, are coupled appropriately to the word write lines. The signal received by CSA and CSB causes those circuits to discharge from a 0 level to a 1 level only the word write line coupled to the memory cells of the selected word read line.

All bit read lines are coupled to a read/write/rewrite circuit which is also partially activated by CSA and CSB in input signals. The information read out on to a bit read line serves as an input to the read/write/rewrite circuit. An output signal of the read/write/rewrite circuit, which is representative of the information which has just been read out of the memory cell, is coupled to a bit write line which is coupled to the input of the memory cell. Since the first transistor of the memory cell is enabled, the information appearing at the input terminal is written into the cell. Thus the information stored in the cell has been rewritten (refreshed).

The CWA and CWB output signals, in addition to being coupled to the horizontal address circuitry, are coupled to a CSC generator circuit. The output signal from the CSC generator circuit is used to activate part of the read/write/rewrite circuitry to allow the read out of information from a selected memory cell.

Circuits coupled to the word write lines detect changes in potential of a word write line and create an output signal which is coupled to a CD generator circuit and a EOC and Z generator circuit. CD and EOC output signals of those generators are coupled, among other places, to the read/write/rewrite circuitry. They control when new information is written into the memory system and serve to reset some of the control circuits to establish initial conditions.

A preferred embodiment of an address buffer inverter circuit which may be utilized with the memory system is also disclosed. This circuit, which is comprised of only IGFETs, requires relatively little power to operate and acts as an isolator between input information driver circuits and the relatively large input capacitance of the horizontal and vertical address circuits of the memory system. When the memory system is not activated the address buffer inverter circuit isolates the information drivers from the address circuitry and thereby lightens the capacitive loading thereon.

Two embodiments of clock signal inverter circuits which may be utilized with the memory system are also disclosed. These circuits, which are both comprised of IGFETs and a resistor, require relatively little power for operation.

These and other objects, features and advantages of the invention will be better understood from a consideration of the following detailed description taken in conjunction with the accompanying drawings.

BRIEF DESCRIPTION OF THE DRAWINGS

FIGS. 3A and 3B illustrate an embodiment of the horizontal address circuitry of FIGS. 1A and 1B;

FIGS. 15A and 15B graphically illustrate the typical input waveforms and the resulting waveforms created as a function of time for a read/only cycle and a read/write cycle of the memory system of FIGS. 1A and 1B;

DETAILED DESCRIPTION

Figure 1A:
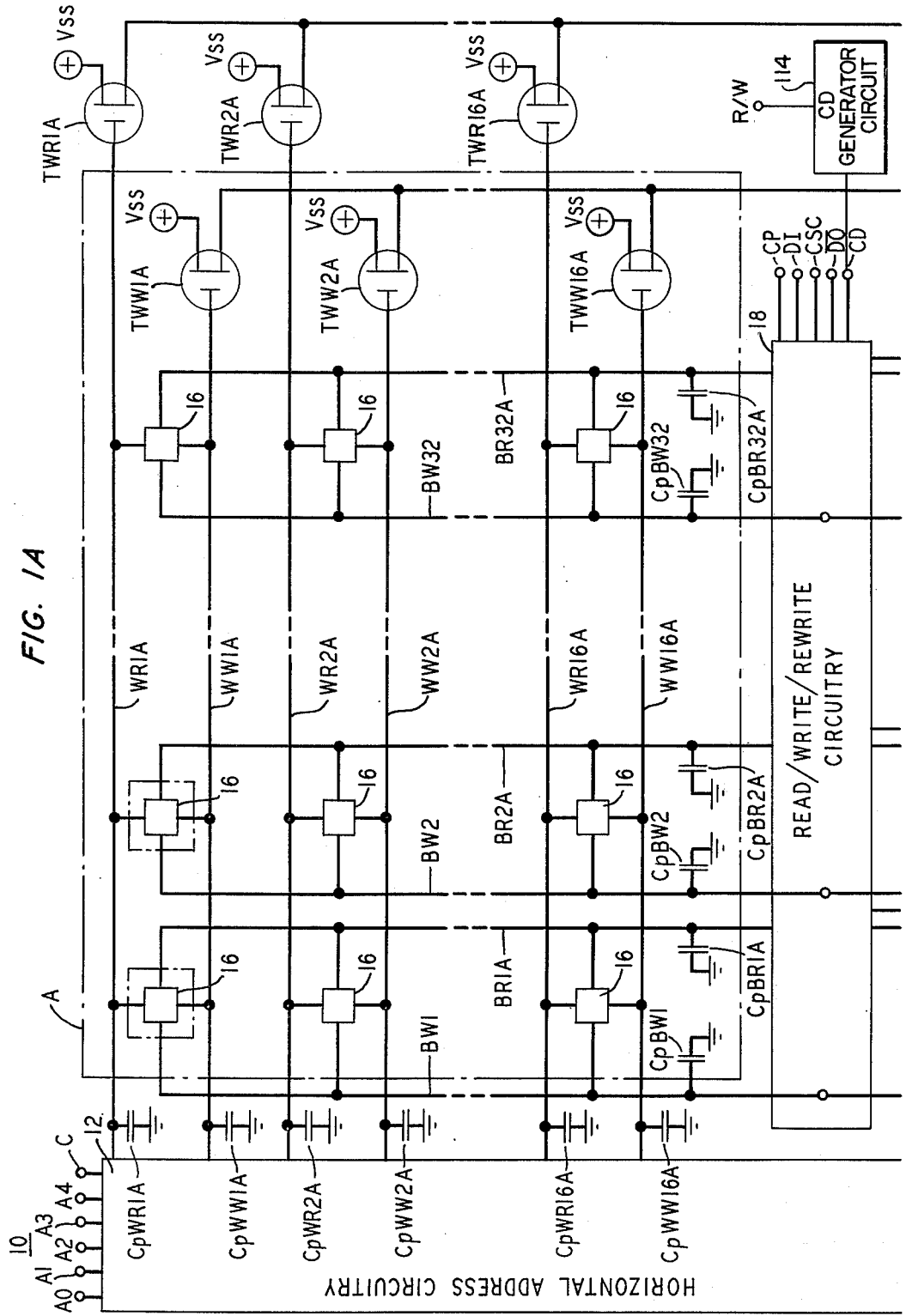
FIGS. 1A and 1B illustrate in schematic and block diagram form an embodiment of a memory system in accordance with this invention.
Figure 1B:
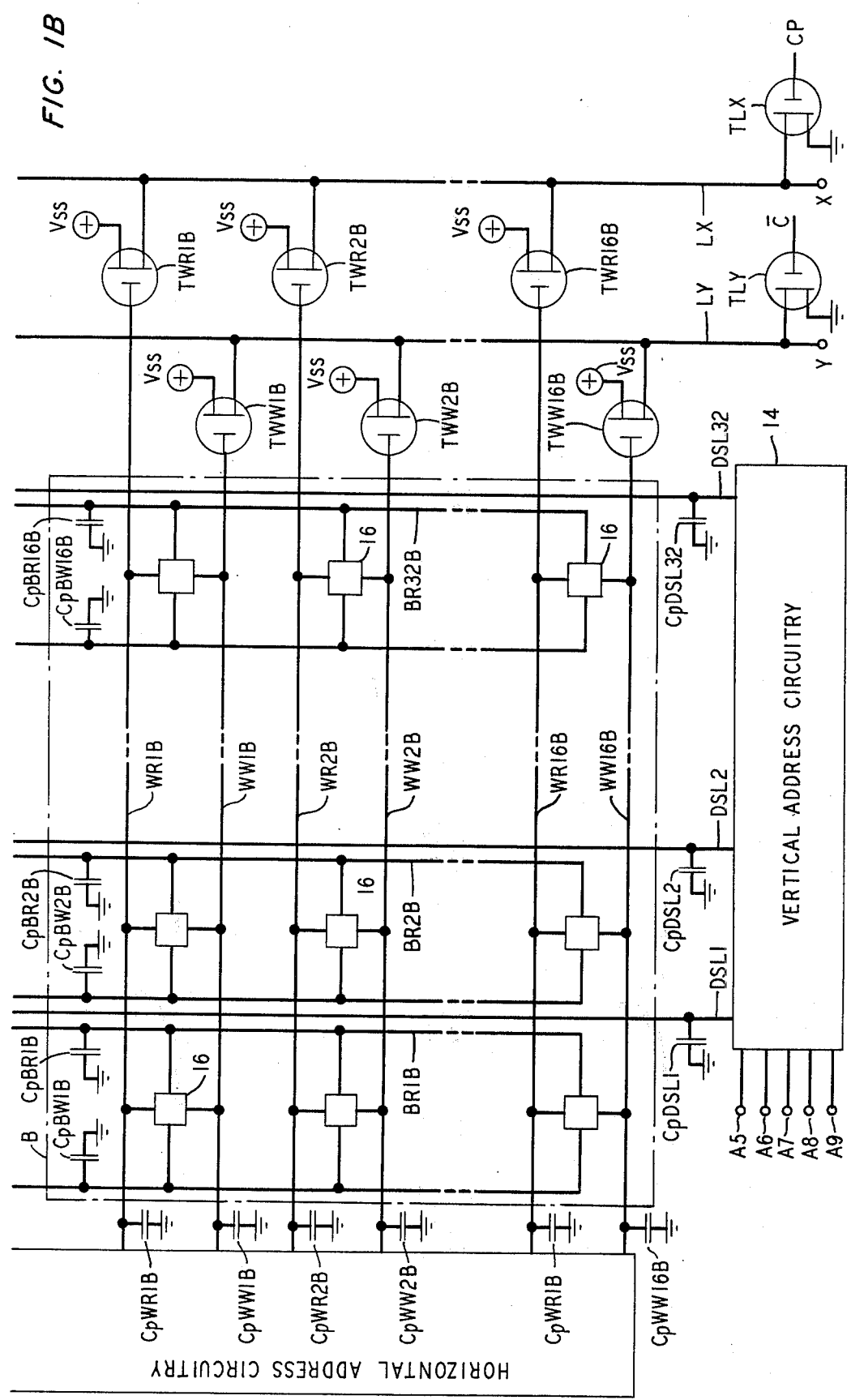

Now referring to FIGS. 1A and 1B there is illustrated a semiconductor memory array system 10 comprising horizontal address circuitry 12, vertical address circuitry 14; and A array of memory cells 16, a B array of memory cells 16, and read/write/rewrite circuitry 18.

The memory cells 16 of array A and array B are arranged in rows and columns. There are two rows and two columns coupled to each of the memory cells 16. The first rows coupled to memory cells of array A are denoted as word line read lines WR1A–16A. The second rows coupled to memory cells of array A are denoted as word line write lines WW1A–16A. The first columns, denoted as BW1–32, are coupled to memory cells 16 of arrays A and B. The second columns coupled to each memory cell of array A are denoted as bit line read BR1A–32A. Likewise the rows and columns of array B are denoted as WR1B–16B, WW1B–16B, Br1B–32B. BW1–32 and BR1A–32A and BR1B–32B aare coupled to the read/write/rewrite circuitry 18. WR1A–16A, WW1A–16A, WR1B–16B, and WW1B–16B are coupled to horizontal address circuitry 12. The vertical address circuitry 14 is coupled to the read/write/rewrite circuitry 18 via digit select lines DSL1–32. Each of WW1A–16A, WR1A–16A, WW1B–16B, WR1B–16B, BW1–32 and BR1A–32A, BR1B–32B, and DSL 1–16, has a separate parasitic capacitance associated with it. The capacitance denoted as Cp WR1A is that capacitance associated with WR1A; that denoted as $C_p$ BR1B is that associated with BR1B; etc.

Input terminals A0, A1, A2, A3, and A4, and C, are connected to horizontal address circuitry 12.

All transistors to be discussed are insulated gate field effect transistors IGFETs.

WR1A–16A are coupled to the gates of transistors TWR1A–16A, respectively. WW1A–16A are coupled to the gates of transistors TWW1A–16A, respectively. WR1B–16B are coupled to the gates of transistors TWR1B–16B respectively, and WW1B–16B are coupled to gates of transistors TWW1B–16B respectively. The sources of TWW1A–16A, TWR1A–16A, TWW1B–16B and TWR1B–16B, are all coupled to power supply + V$ss$. The drains of TWW1A–16A and TWW1B–16B are coupled to a common line LY. The source of a transistor TLY and a Y terminal are also coupled to line LY. A $\overline{C}$ signal is coupled to the gate of TLY. The drain of TLY is coupled to ground potential. The drains of TWR1–16A and TWR1B–16B are coupled to a common line LX. The source of a transistor TLX is coupled to LX. The drain of TLX is coupled to ground potential. A terminal X is also coupled to LX. A CP signal is coupled to the gate of TLX.

The $\overline{DO}$ terminal of 18 serves as the output terminal. The CP, DI, CSC, CD, and R/W terminals receive signals CP, DI, CSC, CD, and R/W, respectively. The R/W input terminal is connected to a CD generator circuit 114 which will be discussed in detail later.

Figure 2:
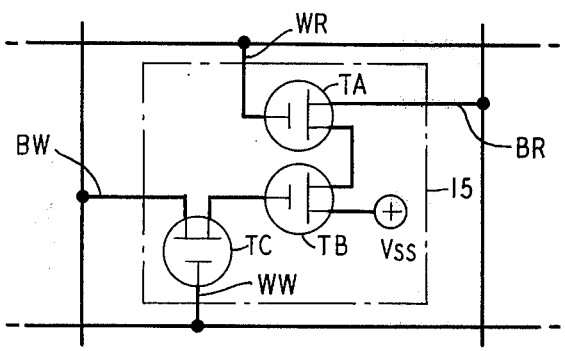
FIG. 2 illustrates one memory cell which can be utilized as the memory cell of the memory system of FIGS. 1A and 1B.

Referring now to FIG. 2 there is illustrated the preferred embodiment memory cell 16. The memory cell 15 of FIG. 2 may be used as the memory cell 16 of FIG. 1. The memory cell 15 comprises three field effect transistors, TA, TB and TC. The drain of TC is coupled to the gate of TB and the drain of TB is coupled to the source of TA. The drain and source of a field effect transistor reverse as the direction of current flow through the transistor reverses. The source of TC is coupled to a BW line; the gate of TC is coupled to a WW line; the source of TA is coupled to a BR line; the gate of TA is coupled to a WR line. In the preferred embodiment the source of TB is coupled to the substrate of an integrated circuit which is connected to supply potential $+Vss$. The basic schematic and storage mode of the memory cell 16 of FIG. 2 is well known. Basically the cell operates as follows:

A 1 or 0 input signal is applied to the source of TC while the gate of TC is biased so as to enable conduction through TC. When the gate of a field effect transistor is biased so as to allow conduction, the transistor will be denoted as enabled or on. The parasitic capacitance associated with the gate of TB and the drain of TC will charge to a 1 if a 1 input signal is applied. Conversely, if a 0 signal is applied the capacitance will charge or discharge to a 0. During the time information is written into cell 15 TA can't conduct because the potential applied to the gate of TA prevents a channel from forming across the drain and source of TA. When the potential applied to the gate of an MOS transistor inhibits conduction through the transistor will be denoted as being disabled. After the information is written into the cell the potential of the gate of TC is adjusted to disable TC and thereby trap any charge stored on gate of TB. This trapped charge represents the stored information.

Stored information is read out by applying a potential to the gate of TA sufficient to enable TA.

If a 1 is stored TB is enabled and there is resulting conduction through TB and TC. If a 0 is stored there is no conduction through TS and TC since TB is disabled. Tyically a 0 is +16 volts and a 1 is between twice the threshold voltage and 0 volts.

Figure 3A:
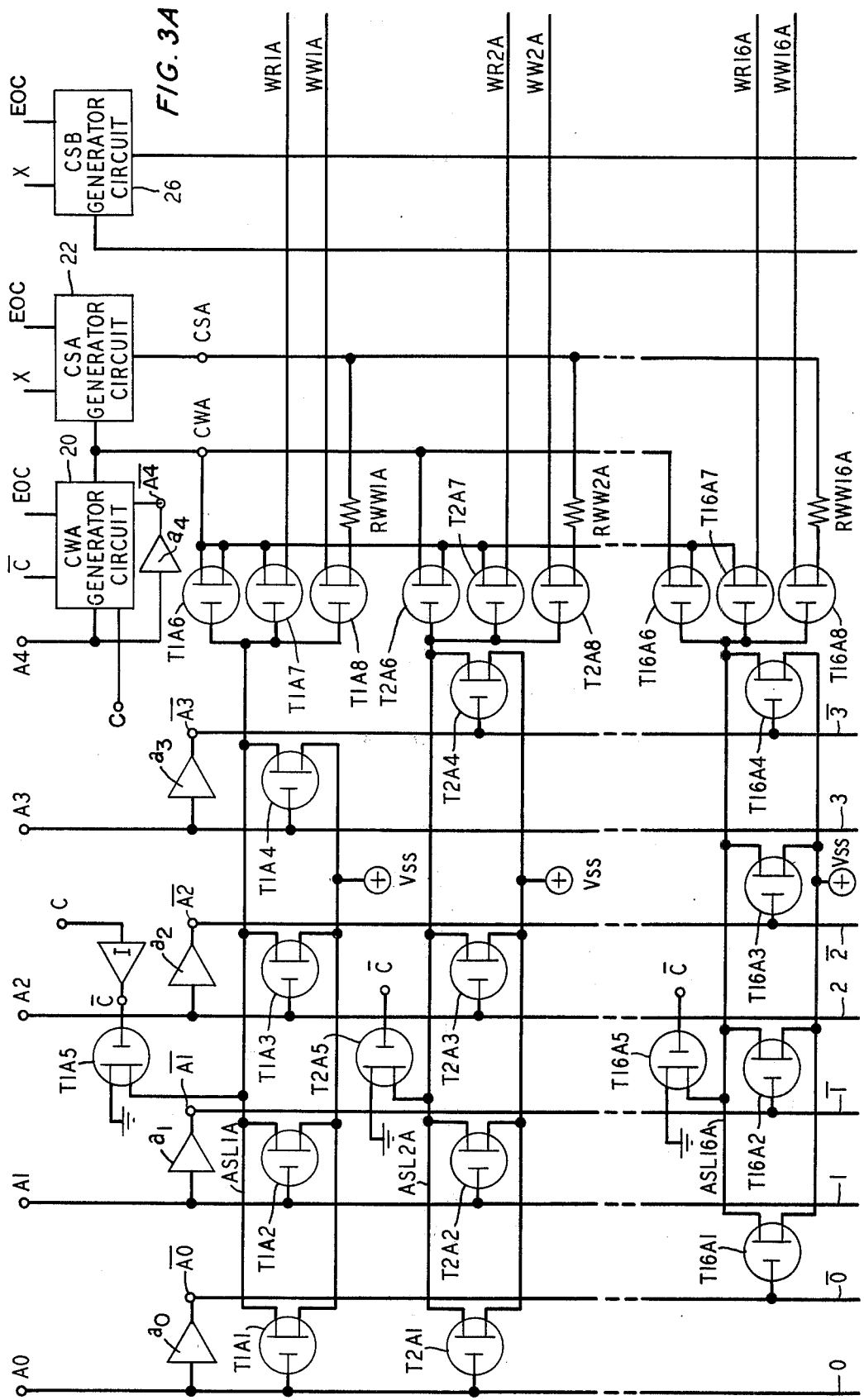

Referring now to FIGS. 3A and 3B there is illustrated a preferred embodiment of the horizontal address circuitry 12 of FIGS. 1A and 1B. The input terminals are A0, A1, A2, A3, A4, and C.

Input terminal $A_0$ is coupled to line 0 and to inverter $a_0$. The output of inverter $a_0$, node $\overline{A_0}$, is coupled to line $\overline{0}$. Input terminal $A_1$ is coupled to line 1 and to inverter $a_1$. The output of inverter $a_1$, node $\overline{A_1}$, is coupled to line $\overline{1}$. Input terminal $A_2$ is coupled to line 2 and to inverter $a_2$. The output of inverter $a_2$, node $\overline{A_2}$, is coupled to line $\overline{2}$. Input terminal $A_3$ is coupled to inverter $a_3$. The output of inverter $a_3$, node $\overline{A_3}$, is coupled to line $\overline{3}$. Input terminal A4 is coupled to inverter $a_4$. The output of inverter $a_4$ is denoted as $\overline{A4}$.

WR1A is coupled to the source of T1A7. The drain of T1A7 is coupled to the output of CWA Generator Circuit 20. The gate of T1A7 is coupled to access select line ASL1A. The drain of T1A7 is also coupled to the source and drain of T1A6. The gates of T1A6 as well as the gate of T1A8 are coupled to ASL1A. T1A6 acts as a capacitor which couples the output of 20 to ASL1A. WW1A is coupled to the source of T1A8. The drain of T1A8 is coupled to the output CSA of CSA generator circuit 22 through resistor RWW1A. Lines 0, $\overline{0}$, 1, $\overline{1}$, 2, $\overline{2}$, 3 and $\overline{3}$ intersect ASL1A such that there are eight positions at which a transistor can be coupled between one of the lines 0 – 3, and ASL1A. As is illustrated, only four of the possible positions are filled by transistors denoted as T1A1, T1A2, T1A3, and T1A4. The sources of these four transistors are all common and are coupled to a power supply $+Vss$. The drains are also common and are coupled to ASL1A. The respective gates are coupled to lines 0, 1, 2 and 3 respectively. The source of a transistor T1A5 is coupled to ASL1A and the gate thereof is coupled through an invertor circuit I to the C input terminal. The drain of T1A5 is coupled to ground potential.

As is illustrated, for each pair of WR and WW of array A and array B there is a separate row of four transistors. No two of the four transistors of a common row are coupled to adjacent lines which receive complementary signals. For example, the transistors of the row corresponding to ASL1A are not coupled to lines 0 and $\overline{0}$, 1 and $\overline{1}$, 2 and $\overline{2}$, or 3 and $\overline{3}$. In addition, none of the four transistors of a given row of the A array occupy the same positions as any another row of the A array. The same is also true of the B array. The first row of transistors T1A1–4 of cirucit 12, which control the WWs and WRs of array A, occupy the same positions in the eight columns as the first row of transistors T1B1–4 of circuit 12, which control the WWs and WRs of array B. The same is true for the second rows and the other corresponding rows 14.

The drains of T1A7–T16A7 are all coupled to the output CWA of 20 and the drains of T1B7–T16B7 are all coupled to the output CWB of CWB generator circuit 24. The drains of T1A8–T16A8 are all coupled to the output CSA of CSA generator circuit 22 through resistance RWW 1A–16A and the drains of T1B8–T16B8 are all coupled to the output CSB of CSB generator circuit 26 through resistors RWW 13–16B.

Input A4 and $\overline{A4}$ as well as C and $\overline{C}$ are coupled to 20 and 24. The output of 20 is coupled to 22 and the output of 24 is coupled to 26. CWA, CWB, and X are coupled to 22 and 26. An EOC (end of cycle) input signal is coupled to 20, 22, 24, and 26. This input signal will be discussed later.

At the beginning of a cycle, before any of A0–A9 inputs are applied to 12 or 14, clock input signal C, which is held at a 0 (typically +16 volts), is negatively pulsed to a 1 (typically 0 volts). $\overline{C}$, which is initially at a 1, is therefore pulsed to a 0. Since $\overline{C}$ is coupled to the gates of T1A5 – T16A5, T1B5 – T16B5 and TDSL16 – 326, (see FIGS. 3 and 4) all of the ASLs of array A and B and all of the DSLs are initially charged to one threshold voltage $Vt$ above ground potential.

Figure 5A:
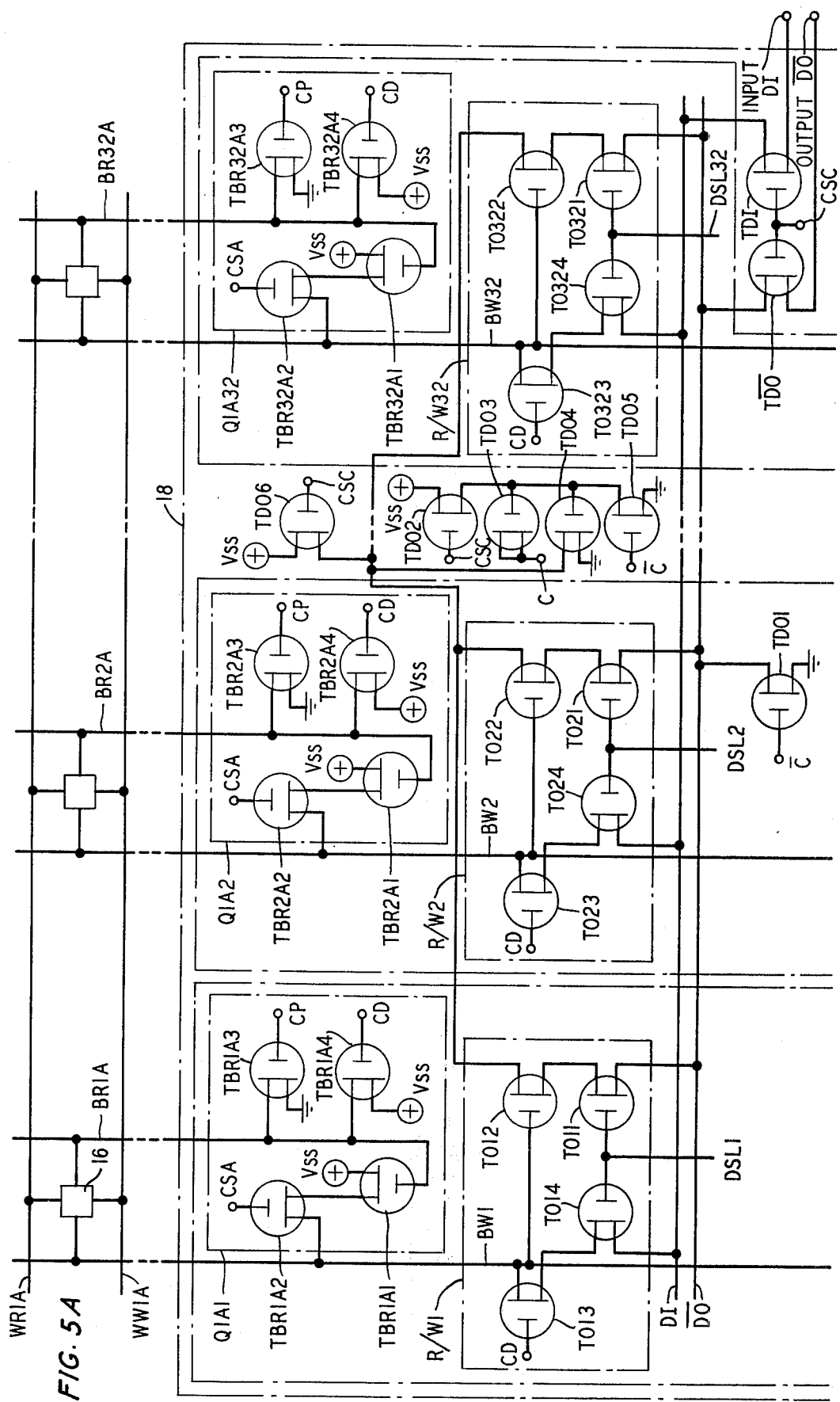
FIGS. 5A and 5B illustrate an embodiment of the read/write/rewrite circuitry of FIGS. 1A and 1B.
Figure 5B:
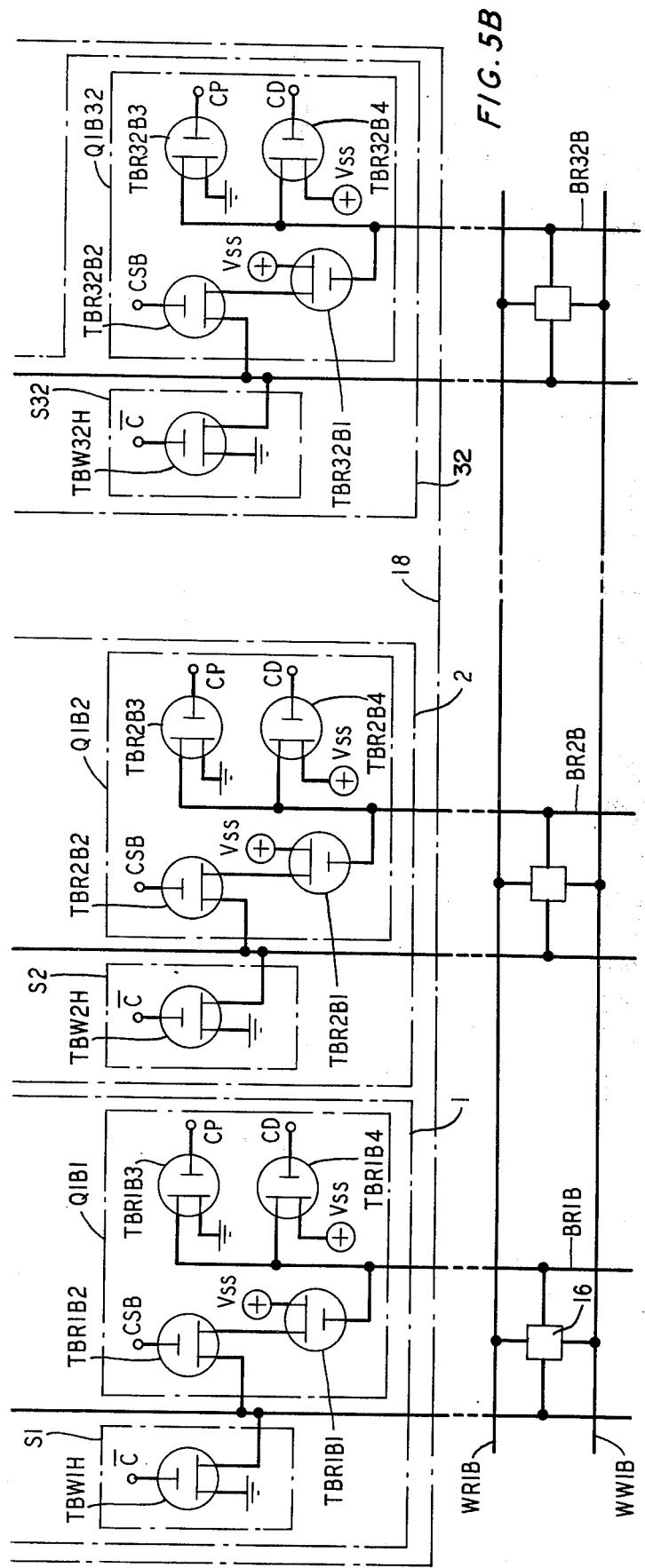

As is illustrated in FIG. 5, transistors TBW1H – TBW32H are each coupled to one of BW1–32 respectively. The drains of each of these 32 transistors are coupled to ground potential and the gates are coupled to $\overline{C}$. This results in all of the BWs being initially set to $+Vt$ above ground potential. BR1A–32A and BR1B–32B are initially set to $+2Vt$ above ground potential. This is accomplished by part of read/write/rewrite circuitry 18 which will be explained in detail later. Initially all WRs and WWs are charged to +16 volts.

Now input signals A0–A9 are applied. It is desired to select the first cell corresponding to WW1A ad WR1A, then all of the input signals to the gates of T1A1–T1A4 of the horizontal address circuits 12 are chosen to be 0's. This keeps all of T1A1–T1A4s off and thereby allows the potential of ASL1A to stay at $+Vt$ volts. ASL1B is also permitted to stay at a potential of $+Vt$ since the transistors coupled thereto receive the same signals as the transistors coupled to ASL1A. All other ASLs array A and B are charged from $+Vt$ to +16 volts. This is because at least one transistor coupled to each of those ASLs receives a 1 on the gate thereof which causes that transistor to conduct and thereby charge the associated ASL to +Vss (typically +16 volts).

After all of the ASLs and DSLs have assumed potentials dictated by address input A signals and C and $\overline{C}$ signals, CWA is automatically lowered in potential from +16 volts to ground potential and CWB is held in potential at +16 volts. This allows only T1A7 to conduct and discharge WR1A to ground potential. The enabling of TC of the selected memory cell 15 allows the read out of information stored in that memory cell 15.

The read out from any memory cell not coupled between WR1A and WW1A is inhibited because only WR1A is allowed to discharge to 0 volts from +16 volts. The TA's of the memory cell 16 of the first row of array A are enabled but those of all other rows of array A and B are disabled. This means that there can be no readout of information from any memory cells except those corresponding to the selected WR and WW.

As has been discussed, the lowering of the potential of CWA from +16 volts to 0 volts causes T1A7 to conduct and thereby discharges WR1A to 0 volts. The reason that T1A7 conducts and T2A7–16A7 do not is that T1A6, which is connected as a capacitor, is enabled and the resulting capacitance between CWA and ASL1A is much greater than that between CWA and any of ASL2A–16A. This is because T2A6–T16A6 are off and therefore act as lower capacitances than T1A6. These lower capacitances do not allow T2A7–T16A7 to be enabled and therefore WR2A–16A remain at essentially +16 volts. None of the WRs of array B can be discharged at this time because CWB is held at +16 volts while CSA is pulsed to 0 volts.

Referring now back to FIGS. 1A and 1B, WR1A is coupled to the gate of TWR1A. When the potential of WR1A is discharged from +16 volts to 0 volts, TWR1A is enabled and conducts. All other TWRAs and TWRBs are held off since all other WRs are held at +16 volts. Initially, the potential of LX is set to +2Vt above ground potential. When WR1A is lowered to 0 volts, TWR1A is enabled and X is charged to +Vss (typically +16 volts). X is coupled to a CSA/CSB generator circuit 22/26 which will be discussed in detail later.

After CWA is pulsed from +16 volts to 0 volts CSA is pulsed from +16 volts to 0 volts. This causes T1A8 to conduct and thereby discharges WW1A to 0 volts. T2A8–T16A8 do not conduct for basically the same reason that T2A7–T16A7 did not conduct when T1A7 conducted in response to the CWA negative voltage pulse. CSB is held at +16 volts during this time and therefore all T1B8–16B8's are held off and consequently all WWBs are maintained at +26 volts.

Figure 4:
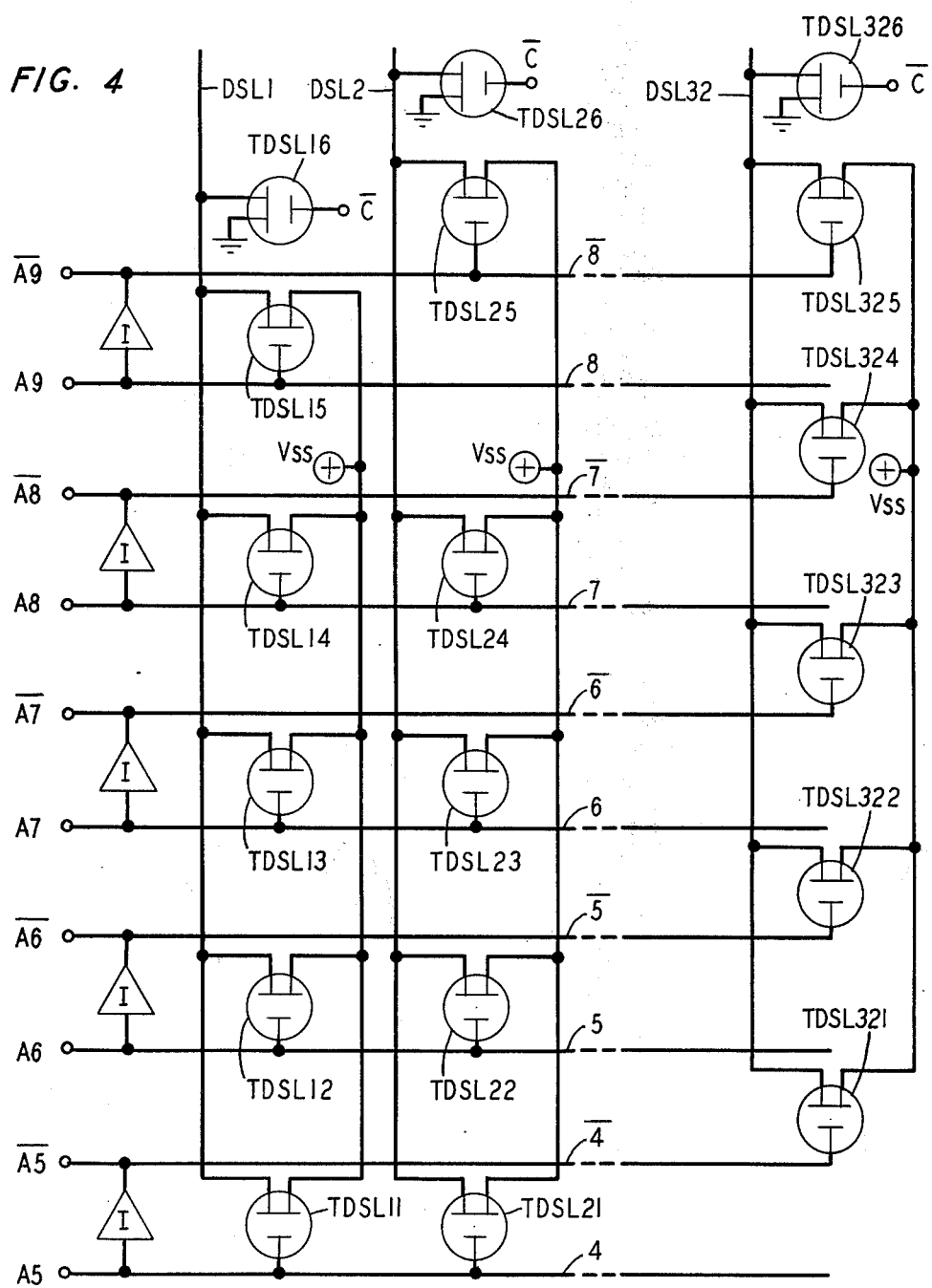
FIG. 4 illustrates an embodiment of the vertical address circuitry of FIGS. 1A and 1B.

Referring now to FIG. 4, there is illustrated the preferred embodiment of the vertical address circuitry 14 of FIGS. 1A and 1B. The input terminals to 14 are A5, A6, A7, A8 and A9. There are five transistors per column. The sources of the five transistors of a common column are coupled together to a power supply +Vss. The drains of transistors TDSL11, TDSL12, TDSL13, TDSL14, and TDSL15 of the first column are common and are coupled to data selected line DSL1. There are 32 DSLs which are denoted as DSL1–32. The source of a separate transistor is coupled to each of DSL1–32. These transistors are designated as TDSL16 through TDSL326. The gates and drains of TDSL16 through TDSL326 are coupled to C and ground potential, respectively. The sources of the five transistors of any column are all coupled together to power supply +Vss which is typically +16 volts. Each of the input terminals A5, A6, A7, A8 and A9 is coupled to a separate one of the lines 4, 5, 6, 7, 8 and 9, respectively. The A5–A8 inputs are also coupled through separate inverter circuits 1 to lines $\overline{4}$, $\overline{5}$, $\overline{6}$, $\overline{7}$, $\overline{8}$ and $\overline{9}$, respectively. The intersection of lines 4–8 with the DSLs causes 10 different locations between a DSL and lines 4–8 at which a transistor can be coupled between one of the lines and the DSL. It is the gate of a transistor which is coupled to a line 4–8 and the drain which is coupled to a DSL. There are 32 columns of five transistors per column but the location of the five transistors of any column is different from all other rows. In addition no two locations which have complementary lines (e.g., 3 and $\overline{3}$) have transistors in both locations.

Initially, like the ASLs, the DSLs are set to +1Vt above ground by the $\overline{C}$ signal and then allowed to float at that potential. Input signals are then applied to A5–A8, which in turn cause signals to appear on lines 5–8. The DSL to be selected has 0's (+16 volts) applied to the gates of the five transistors coupled thereto. The application of 0's to these five transistors maintains them disabled such that the DSL coupled thereto is maintained at +1Vt above ground potential. All other nonselected DSLs will be charged to +16 volts since at least one transistor coupled to each of these DSLs receives a 1 on the gate thereof which enables that transistor. This charges the respective DSL to +Vss (+16 volts). It is thus apparent that the vertical address circuitry 14 selects and activates only one out of the 32 DSLs.

Referring now to FIG. 5 there is illustrated the preferred embodiment of the read/write/rewrite circuitry 18, which comprises 32 subcircuits denoted as subcircuits 1–32. Each of the subcircuits comprises four subcircuits. The four subcircuits of subcircuit 1 are denoted as Q1A1, Q1B1, R/W1 and S1. The four subcircuits of each of subcircuits 2–32 are also appropriately denoted as is illustrated.

The Q1A1 circuitry comprises four transistors, TBR1A1–4. The drain, source, and gate of TBR1A2 are coupled to BW1, the drain of TBR1A1, and CSA, respectively. The source and gate of TBR1A1 are coupled to power supply +Vss, and BR1A, respectively. The drain, source and gate of TBR1 4 are coupled to BR1A, and CD, respectively. The drain, source and gate of TBR1A3 are coupled to BR1A, ground potential, and CP, respectively.

The Q1B1 circuitry is identical to the Q1A1 circuitry except that it is coupled to BR1B. It also comprises four transistors TBR1B1–4. The input to the gate of TBR1B2 is CSB instead of CSA.

R/W1 of subcircuit 1 comprises four transistors, T011–014. The gates of T011 and T014 are common and are coupled to DSL1. The drain of T011 is coupled to line D0 and the source of T014 is coupled to line DI. The drain of T014 is coupled to the source of T013. The gate and drain of T013 are coupled to CD and BW1, respectively. The source of T012 is coupled to the drain of TD06 and the drain of T012 is coupled to the source of T011. The gate of T012 is coupled to BW1 and the drain of T013.

Subcircuits 2–32 each contain one of the R/W2–32 subcircuits. R/W2–32 are identical to R/W1. Of course, each of these subcircuits is coupled to one of the lines BW2–BW32.

Subcircuit S1 of subcircuit 1 comprises a single transistor TBW1H. The source, gate and drain are coupled to BW1, $\overline{C}$ and ground potential, respectively. S2–S32 of subcircuits 2–32 also each contain a single transistor which is coupled between ground potential, $\overline{C}$ and the appropriate BW2–32.

Line DI is coupled to the drain of a transistor TDI and line $\overline{DO}$ is coupled to the source of a transistor $T\overline{DO}$. The gates of transistor $T\overline{DO}$ and TDI are coupled together to signal CSC. The source of transistor TDI serves as the input terminal for information to be written into a memory cell 16 of array A or B. The drain of transistor $T\overline{DO}$ serves as the output terminal of the entire memory system 10 of FIGS. 1A and 1B.

The drain, source and gate of TD01 are coupled to ground potential, $\overline{DO}$ and $\overline{C}$, respectively. The drain, source, and gate of TD05 are coupled to ground potential, $\overline{C}$ and the gate of TD04. The drain, source and gate of TD04 are coupled to ground potential, the drain of TD06 and the gate of TD03, respectively. The drain and source of TD03 are coupled together to C. The gate of TD03 is coupled to the drain of TD02. The gate and source of TD02 are coupled to CSC and +V$ss$, respectively. The gate and source of TD06 are coupled to CSC and +V$ss$, respectively.

Initially each of BW1–32 is set to +1V$t$ above ground potential since the $\overline{C}$ input to TBW1h–32H at a 1. When the $\overline{C}$ input is switched to a 0 all the BWs float in potential at +1V$t$ above ground potential. The BRAs and BRBs are all initially set to +2V$t$ above ground potential and then are allowed to float at that potential. The CP input to TBR1A3–32A3 and TBR1B3–32B3 first enables all of the transistors and thereby charges all the BRs to +2V$t$ and then disables the transistors. This leaves the BRs all floating at +2V$t$ above ground potential.

Data Input terminal DI is used to write new information into any selected memory cell. Data Output inverted $\overline{DO}$ is used to retrieve stored information from any selected memory cell. CP, DC, CSA, CSB, $\overline{C}$, and CSC are all created by circuitry which is fabricated on the same integrated circuit chip as the memory array itself. These circuits will be explained in detail later.

As has been discussed, when there is readout from the selected cell 16 BR1A either remains a +2V$t$ or is increased to +16 volts depending on what information is stored in the cell. If BR1A remains at +2V$t$, this is indicative of a 0 stored in the cell (the gate of TB of the selected memory cell 16 is at +16 volts). Conversely, if the potential of BR1A goes to +16 volts this is indicative of a 1 stored in the cell 16 (the gate of TB of the selected memory cell 16 is at 0 volts). Before any change in the potential of BR1A occurs CSA is pulsed from +16 volts to 0 volts. This causes WWA1 to be discharged from +16 volts to 0 volts. If the potential of BR1A stayed at +2Vt then TBR1A1 is enabled and conducts. This changes BW1 to +16 volts a 0. This +16 volts is applied to the source of TC of the selected memory cell 16. Since WW1A is at 0 volts the +16 volts on the source of TC charges the gate of TB to +16 volts. If the potential of BR1A went to +16 volts, TBR1A1 is disabled and the potential of BW1 stays at +16V$t$ above ground potential. Thus the stored information is automatically refreshed.

The information from the selected memory cell 16 that has been transferred from BR1A to BW1 is detected as follows: The CSC input to $T\overline{LO}$ is pulsed from a typical value of +16 volts to 0 volts. This enables $T\overline{DO}$, TDO2, and TDO6. As a consequence of TDO2 being enabled, the gate of TDO4 is set to a 0. This disables TDO4. Now the $\overline{DO}$ line is unclamped and floats at ground potential. TO11 of subcircuit 1 is already enabled because DSL1 has already been set to +1V$t$ above ground potential. If +Vt is present on BW1 then TO12 is enabled and current flows from +Vss through TDO6, TO12, TO11 and $T\overline{DO}$. The current flow through $T\overline{DO}$ at this point in time is defined as the readout of a 0. A 0 is the inverse of the information stored in the selected cell which is a 1. Since the output is known to produce the inverse of what is read out of a selected cell it is known that the selected cell contains a stored 1. If the cell contains a stored 0, then BW1 is set +16 volts and TO12 cannot conduct since it is disabled. There is essentially no conduction through $T\overline{DO}$. This condition is defined as the readout of a 1. This means that the stored information in the selected memory cell 16 is a 0.

After the readout of information from the selected cell it is possible to write new information in the cell before the end of the cycle. This type of cycle will be denoted as a read/write cycle as compared to a read-/only cycle in which no new information is inserted into the memory. During a read only cycle R/W is held at a 0 throughout the entire cycle. During a read-write cycle R/W is pulsed to a 1 level just prior to the time CSC is pulsed from a 0 to a 1 level. The R/W input as well as the output signal at terminal Y, and the CSC, C, $\overline{C}$, and CD signals all serve as inputs to an EOC and Z generator circuit which will be discussed in detail later. The EOC and Z outputs of this generator circuit are coupled to circuitry (also to be discussed later) which control the generation of CD, CWA, CWB, CSA, CSB, and CSC. During a read only cycle the Y input to the EOC and Z generator causes the EOC signal to be switched from a 0 to a 1. The EOC signal is coupled to CWA and CWB, and CSA and CSB. When EOC goes to a 1 CWA, CWB, CSA, and CSB are reset to 0 output levels. However, during a read-write cycle the presence of a 1 on the R/W input just prior to CSC going to a 1 causes EOC to be temporarily held at the 0 level. The R/W 1 input is also coupled to a CD generator (to be discussed later) which is a 0 throughout the entire read/only cycle. The 1 input of the R/W causes the CD generator circuit to be pulsed from a 0 level to a 1 level. This pulsing of CD to the 1 level enables TBR1A4–TBR32A4 and TBR1B4–TBR32B4 such that BR1A–BR32A and BR1B–BR32B are all set to +V$ss$ (typically +16 volts). The +16 volts appears on the gates of TBR1A1–TBR32A1 and TBR1B1–TBR32B1. All of these transistors are thus disabled and therefore all the BWs are electrically isolated from the BRs and consequently the +V$ss$ on the sources of all of these disabled transistors. Transistors TO13–TO323 are all enabled by CD at this time. Of the 32 DSLs only DSL1 is at a 1 level. All the others are at the 0 level.

This means that TO14 is enabled while TO24–TO324 are disabled. Since CSC is coupled to the gate of TDI, TDI is enabled and therefore an input signal coupled to the source of TDI will propagate through TDI, TO14 and TO13 and charge BW1 to a 1 if the input signal is a 1 and to a 0 if the input signal is a 0. WW1A is still at a 0 and therefore the information on BW1 is written into the selected memory cell 16. Since the CD is an input to the EOC and Z generator circuit, the EOC output signal will, after an appropriate delay, drop to a 1 level in response to the CD signal dropping to the 1 level. This delayed drop of the EOC signal to the 1 level is coupled back to the CD generator circuit. This causes the CD output signal to be pulsed back to the 0 level.

The dropping of the EOC signal to the 1 level, like the equivalent drop during the read-only, signal resets CWA and CSA back to the 0 level. This, as before, resets WR1A and WW1A to +16 volts, the initial condition. As before when the C input signal returns to 0 level, the $\overline{C}$ signal will rapidly return to a 1 level. This resets the entire memory system in the same manner as during the read-only cycle.

Figure 6:
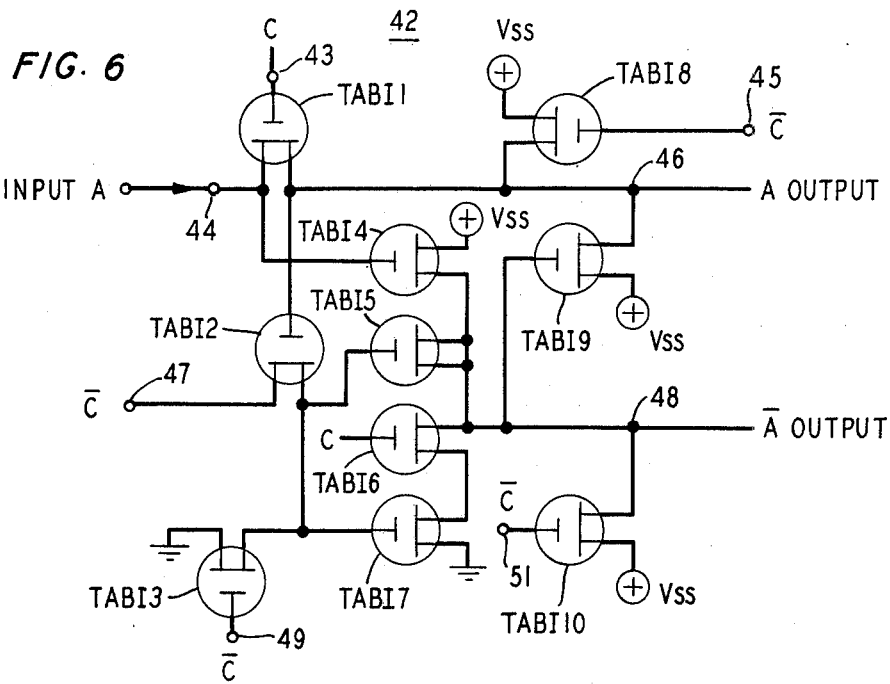
FIG. 6 illustrates an embodiment of an address buffer inverter circuit which may be used with the memory system of FIGS. 1A and 1B.

Referring to FIG. 6, there is illustrated the preferred embodiment of an address buffer inverter circuit 42. Instead of applying input signals A0 through A9 directly to all the address and control circuits of the memory array 10 of FIGS. 1A and 1B, it is desirable to first put these signals through a buffer stage. Since inverted input signals are needed, the buffer stage also should provide an inverted output terminal as well as a noninverted output terminal. Circuit 42 comprises transistors TABI1-10. An input signal (for example AO) is coupled to terminal 44, which is coupled to the sources of TABI1. The source of TABI1 is also coupled to the gate of TABI4. A C (clock) input signal is applied to terminal 43 which is coupled to the gate of TABI1. The drain of TABI1 is coupled to the drains of TABI8 and TABI9. Terminal 46, which serves as the noninverted output of circuit 42, is also coupled to the drains of TABI8 and TABI9. The sources of TABI8 and TABI9 are both coupled to power supply +V$ss$. The gate of TABI8 is coupled to terminal 45 which is coupled to signal $\overline{C}$ (the inverse of C). The circuit which creates $\overline{C}$ will be discussed in detail later. The drain of TABI1 is coupled to the gate of TABI2. Signal $\overline{C}$ is coupled to terminal 47 which is coupled to the source of TABI2 and the drain of TABI2 is coupled to the gate of TABI5 and to the gate of TABI7 and to the source of TABI3. The gate and drain of TABI3 are coupled to terminal 49 and ground potential, respectively. Terminal 49 is coupled to $\overline{C}$. The source of TABI4 is coupled to +V$ss$ and the drain is coupled to the drain and source of TABI5. TABI5 acts as a capacitor which couples the drain of TABI4 to the drain of TABI2. The source of TABI6 is coupled to the drain of TABI5, the gate of TABI9 and the drain of TABI10. Terminal 48, which serves as the inverted output terminal of circuit 42, is coupled to the source of TABI6. The gate and source of TABI10 are coupled to terminal 51 and +V$ss$, respectively. Terminal 51 is coupled to $\overline{C}$. The gate and drain of TABI6 are coupled to C and the source of TABI7, respectively. The drain of TABI7 is coupled to ground potential.

The input signal to terminal 44 can be a 1 or a 0. Assuming that the clock signal is switched at a 1, then transistor TABI1 and TABI6 are both enabled. Since $\overline{C}$ is the inverse of C, TABI3, TABI8 and TABI10 are both off. Initially the C is at a 0 and output terminals 46 and 48 are isolated from input terminal 44. Typically, a C 0 is +16 volts and a C 1 is 0 volts. At this point in time, the $\overline{C}$ signal is at a 1 level which enables transistors TABI8 and TABI10, thereby causing output terminals 46 and 48 to both change to +16 volts which represents 0's. An input signal, for example, a 1, is now applied to terminal 44 and then the clock signal is set to a 1 and the corresponding $\overline{C}$ signal is set to a 0. Since TABI1 is on (enabled), the input 1 signal propagates through TABI1 and discharges output terminal 46 to a 1 level. The inverted output appearing at terminal 48 stays at a 0 (+16 volts) since TABI2 and TABI4 are on (enabled) and, therefore, the $\overline{C}$ signal a 0, appears on the gate of TABI7. This keeps TABI7 off and thereby does not allow output terminals 48 to discharge through TABI6, which is enabled, into TABI7 and then to ground. Since TABI4 is enabled terminal 48 is charged and held at +V$ss$.

Now assuming the input signal is a 0, (typically +16 volts) as before, outputs 46 and 48 are both initially charged to 0's. TABI1 turns on and since output terminal 46 is already at a 0, it does not change state. The gate of TABI2 receives a 0 (+16 volts), and therefore TABI2 is off. This means that the gate TABI7, which is initially charged to approximately 1 threshold voltage +1Vt above ground potential, is enabled. In addition, TABI6 is also enabled. The +16 volts of terminal 48 therefore discharges into the series combination of TABI6 and TABI7. As the voltage on output terminal 48 drops towards 0 volts, a 1, the capacitive coupling (enabled TABI5) between the source of TABI6 and the gate of TABI7 serves to keep TABI7 heavily on and therefore rapidly discharges inverter output terminal 48 to the 1 level.

The purpose of TABI9 is to insure that even if the input signal is significantly less positive than +16 volts, that the output terminal 46 still in fact assumes a potential close to +16 volts. Typically a weak 0 might be 13 to 15 volts. It is significant to note that during all operations of circuit 42, there is no sustained DC power drawn.

Figure 7:
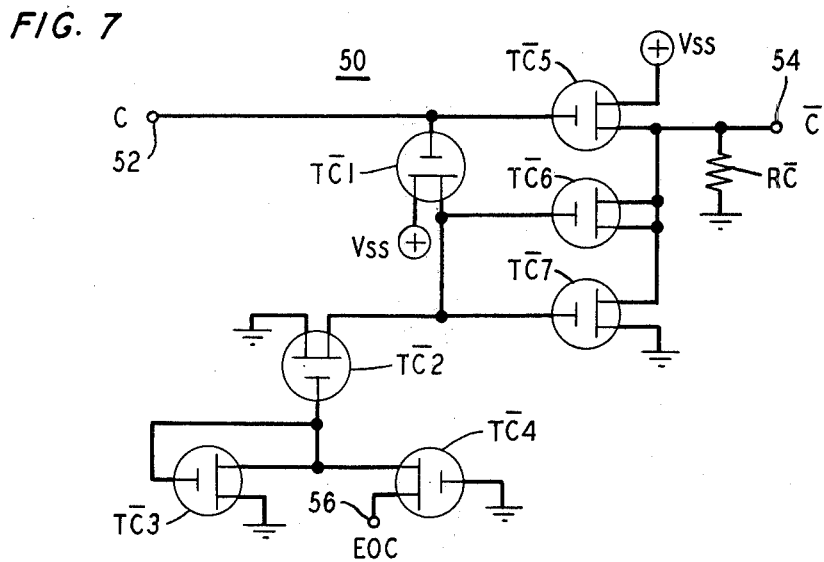
FIG. 7 illustrates an embodiment of a clock signal inverter circuit which may be used as part of the memory system of FIGS. 1A and 1B.

Now referring to FIG. 7, there is illustrated an embodiment of a $\overline{C}$ generator circuit 50 which comprises transistors TC1–7 and resistor R$\overline{C}$. A clock signal C is coupled to input terminal 52 which is coupled to the gates of T$\overline{C}$1 and 5. The sources of T$\overline{C}$1 and 5 are both coupled to +V$ss$. The drain of T$\overline{C}$1 is coupled to the gate of T$\overline{C}$6 and the source of T$\overline{C}$2 and the gate of T$\overline{C}$7. The drain of TC5 is coupled to the drain and source of TX6 and to the source of T$\overline{C}$7. One terminal of a resistor R$\overline{C}$ is coupled to the source of T$\overline{C}$7. An output terminal 54 is also coupled to the source of T$\overline{C}$7. The second terminal of R$\overline{C}$ and the drain of T$\overline{C}$7 are both coupled to ground potential. The drain of T$\overline{C}$2 and the drain of T$\overline{C}$3 and the gate of TC4 are all coupled to ground potential. The gate of T$\overline{C}$2 is coupled to the gate and source of T$\overline{C}$3 and to the drain of T$\overline{C}$4. The source of TC4 is coupled to a terminal 56 which receives a signal denoted as EOC (end of cycle signal).

Assuming initially that the C input is at a 0 (typically +16 volts) and EOC is also at a 1, then it is easy to see that there can be no flow of dc current through any of the transistors T$\overline{C}$1 through T$\overline{C}$7 and output terminal 54 will be at essentially ground potential or 0 volts which is defined as a 1. Now assume that C is lowered to a 1 potential (typically 0 volts), both T$\overline{C}$1 and 5 are enabled and therefore the drains of T$\overline{C}$5 and 1 both rapidly charge to +V$ss$ which is typically +16 volts. Since output terminal 54 is coupled to the drain of T$\overline{C}$5, it is set to 16 volts and steady state conduction occurs through T$\overline{C}$5 and R$\overline{C}$. T$\overline{C}$2 and 7 are both off since their respective gates are both at approximately +16 volts. The reason that the gate of T$\overline{C}$2 is at 16 volts is that the EOC signal is still +16 and therefore the drain of T$\overline{C}$4 which is coupled to the gate of T$\overline{C}$2 is at 16 volts.

Now after a preselected period of time, the C signal returns to a 0. Prior to the time that the C signal is returned to a 0, the EOC signal at terminal 56 is adjusted to a 1. After the C signal attains a 0, the changing of the EOC signal to a 1 causes $\overline{TC2}$ to go on and therefore drops the potential at the source of $\overline{TC2}$ to a value somewhat less then +16 volts and causes $\overline{TC7}$ to be partially enabled. When the C signal then returns to a 0 $\overline{TC1}$ and $\overline{TC5}$ are disabled and the gate of $\overline{TC7}$ can then be discharged to a negative potential. This turns $\overline{TC7}$ on heavily and therefore allows the potential of output terminal 54, the $\overline{C}$ output signal, to drop very rapidly to 0 volts a 1. $\overline{TC6}$ which, as is illustrated, is connected such that it serves a capacitance which couples the source and gate of $\overline{TC7}$. This capacitance serves to couple any change in voltage at the source of $\overline{TC7}$ back to the gate and thereby causes $\overline{TC7}$ to turn on faster and harder than otherwise would be the case. Thus, the potential of output node 54 is very rapidly lowered from a 0 level to a 1 level. The purpose of $\overline{TC3}$, which is connected as a diode which couples the gate of $\overline{TC2}$ to ground potential, is to prevent the potential of the gate of $\overline{TC2}$ from going below a threshold voltage below ground potential. When the gate of $\overline{TC2}$, which is capacitively coupled to the source, is driven low there is a tendency, because of a parasitic coupling between the gates of $\overline{TC2}$ and $\overline{TC7}$, for $\overline{TC2}$ to be turned on and thereby charge the gate of $\overline{TC7}$ to ground potential instead of allowing it to go more negative. The coupling the gate of $\overline{TC2}$ to a potential, which is no more negative than 1Vt below ground negated this possibility.

Figure 8:
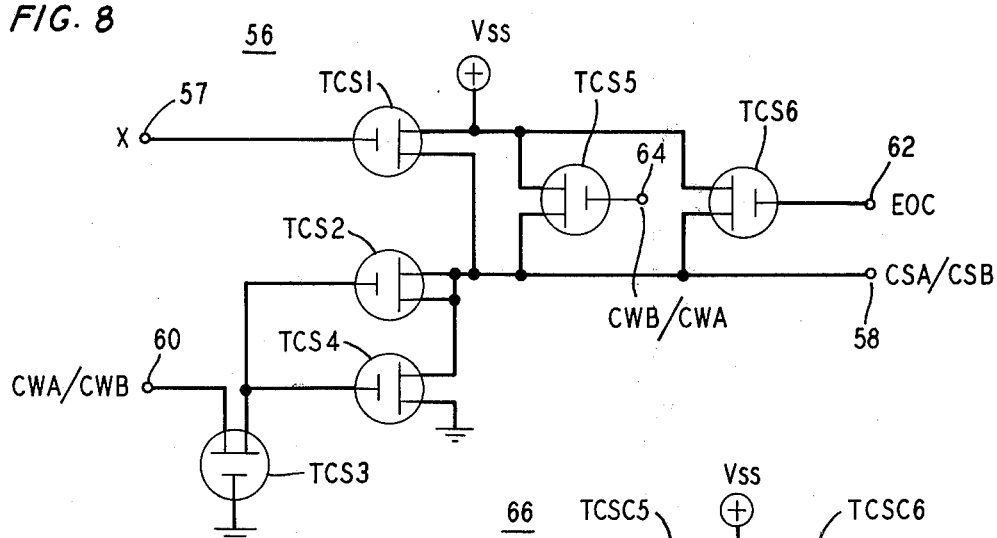
FIG. 8 illustrates an embodiment of a CSA/CSB generator circuit which may be used as part of the memory system of FIGS. 1A and 1B.

Referring now to FIG. 8, there is illustrated the preferred embodiment of the CSA/CSB generator circuit 56 which comprises transistors TCS1–6. The gate of TCS1 is coupled to an input terminal 57 which is coupled to the X terminal of FIGS. 1A and 1B. The sources of TCS1, TCS5 and TCS6 are all coupled to +Vss and the drains are all coupled together. The source of TCS4 is coupled to the drain and source of TCS2 and the drain of TCS1. An output terminal 58 is coupled to the source of TCS4. The gate of TCS2 and TCS4 are coupled together to the source of TCS3. The gate of TCS3 and the drain of TCS4 are both coupled to ground potential. The drain of TCS3 is coupled to an input terminal 60. An input terminal 62 is coupled to the gate of TCS6 and another terminal 64 is coupled to the gate of TCS5. In order to obtain an output CSA signal at terminal 58 it is necessary to apply an EOC signal at terminal 62, a CWB signal at terminal 64, a signal from LX at terminal 57 and a CWA signal at terminal 60. In order to obtain a CSB output signal at terminal 58, a CWB signal is substituted for the CWA signal at terminal 60 and a CWA signal is substituted for the CWB signal at terminal 64.

At the start of a cycle of the memory system 10 of FIGS. 1A and 1B input signals CWA, CWB, and EOC are all at 0 levels and input signal X is at a 1 level. Assuming it is desired to obtain the CSA output of circuit 56 then the CWA signal is applied to terminal 60 and the CWB signal is applied to terminal 64. The above combination of input signals causes TCS1 and 3 to be enabled but there is no conduction in TCS1–6. The drain of TCS1 and terminal 58 are at the 0 level at this point in time. CWA now switches to a 1 level. This causes TCS3 to conduct and thereby enables TCS4 by discharging the gate of TCS4 to +1Vt ground potential. At this point in time TCS1 and TCS4 are enabled and conducting. TCS2 is also enabled and thus has a greater capacitance than when disabled. The potential of terminal 58 is controlled by TCS1 because the physical size of TCS1 is substantially greater than that of TCS4. The potential of terminal 58 is somewhat less positive than + 16 volts which is the typical value of +Vss.

Now input signal X goes to a 0 level which disables TCS1. The potential of terminal 58 is no longer clamped at +16 volts and since TCS4 is still enabled, terminal 58 discharges into TCS4. As the potential of terminal 58 drops from +16 volts towards 0 volts the gate of TCS4 drops in potential due to the capacitive coupling effect of TCS2. This decrease in potential of the gate of TCS4 turns TCS4 on even harder and terminal 58 is rapidly discharged to a 1 level from the 0 level.

Now the EOC signal goes from a 0 level to a 1 level. This causes TCS6 to be enabled. Conduction now occurs through TCS6 and TCS4. TCS6 is essentially of the same physical size as TCS1 and therefore terminal 58 assumes a potential close to +Vss, which is a 0 level since the physical size of TCS4 is much smaller than that of TCS6. Two separate circuits 56 are used to create CSA and CSB signals. The timing of these two signals enables the appropriate WW of array A or B to be activated at the proper point in time so as to facilitate the refreshing of information of the selected memory cell 16 of FIGS. 1A and 1B. Graphs of the waveforms described above will be discussed later.

Figure 9:
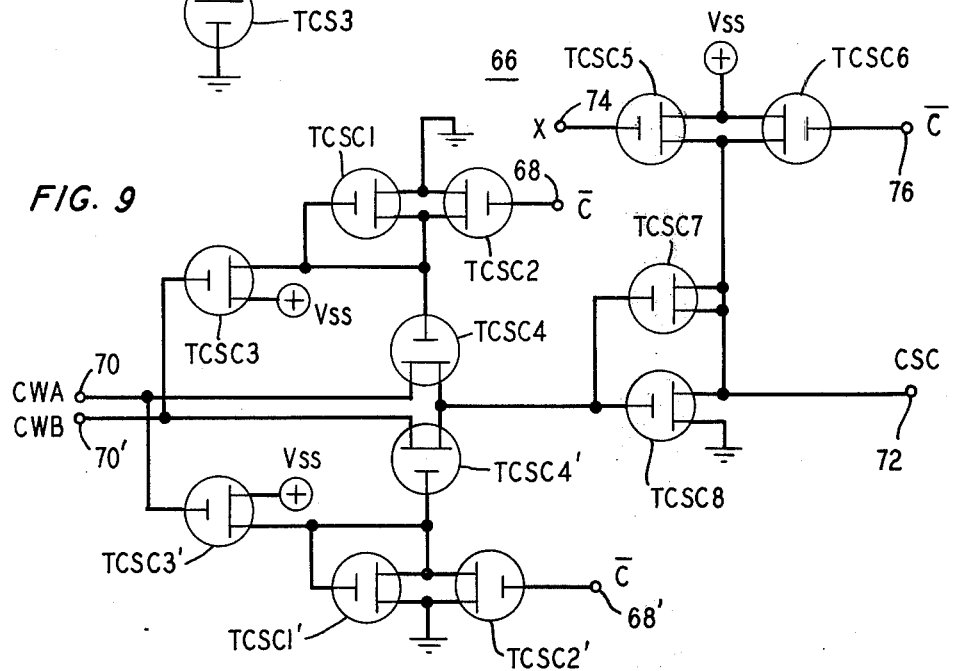
FIG. 9 illustrates an embodiment of a CSC generator circuit which may be used as part of the memory system of FIGS. 1A and 1B.

Now referring to FIG. 9, there is illustrated a preferred embodiment of a CSC generator circuit 66, which comprises transistors TCSC1–7 and TCSC1'–4'. The sources of TCS1, TCSC2, TCSC1', and TSCS2', are all coupled to ground potential. A $\overline{C}$ input signal is applied to terminal 68 and 68'. The gates of TCSC2 and 2' are coupled to terminals 68 and 68', respectively. The drains of TSC3 and 3' are coupled to the gates of TCSC1 and 1', respectively, and TCS4 and TCS4', respectively. The drains of TCSC1 and 2 are common and are coupled to the gate of TCSC4. The drains of TCSC4 and 4' are common and coupled to the gate of TCSC8 and TCSC7. TCSC7 is connected as a capacitor that couples the source and the gate of TCS8. Input terminals 70 and 70' are coupled to the sources of TCSC4 and 4' respectively. A CWA input signal is coupled to terminal 70 and a CWB input signal is coupled to terminal 70'. The sources of TCSC3 and 3' are both coupled to +Vss. The drains of TCS5, 6, and 7 and the sources of TCSC7 and TCSC8 are all coupled together to terminal 72 which serves as the CSC output terminal. The drain of TCSC8 is coupled to a ground potential. The sources of TCS5 and 6 are common and are coupled to +Vss. An X input signal is coupled to terminal 74 which is coupled to the gate of TCS5. A $\overline{C}$ input signal is coupled to terminal 76 which is coupled to the gate of TCSC6.

Initially $\overline{C}$ is at a 1 level and CWA and CWB are both on 0 level. This enables TCSC2 and 2' which cause the gates of TCS4 and 4' to be approximately +1 volt above ground potential. This means that TCSC4 and 4' are enabled and that the gate of TCSC8 is at a 1 level. TCSC5 and 6 are both enabled and then terminal 72 is at +Vss which is a typically 0. Thus the output is initially at a 0 level. The $\overline{C}$ signal now goes to the 0 level thereby leaving the potentials of TCSC4 and 4' floating at +1 volt above ground potential. Terminal 72 is held at a 0 because TCSC5 is held enabled by the X input signal even though TCSC6 is disabled by the $\overline{C}$ signal. The CWA or CWB now assumes a 1 level. Due to the symmetry of the circuitry coupled between CWA and CWB and TCSC8 if either goes to a 1 the effect of the potential on the gate of TCSC8 is the same. It is assumed that a memory cell of array A of FIG. 1A and 1B is being read out then CWA goes to a 1 level and CWB stop at the 0 level. Since TCSC4 is enabled at this point in time conduction occurs through TCSC4 which couples the negative pulse of CWA to the gate of TCSC8 and thereby discharges the gate of TCSC8 to ground potential. TCSC3' is also enabled at this time and therefore the gate of TCSC4' is charged to a 0. This disables TCSC4' and therefore isolates the gate TCSC8 from terminal 70'. TCSC8 is therefore enabled and conduction through TCSC5, 7, and 8 occurs for a short period of time until X goes to a 0 level. At this point conduction ceases through TCSC5 but continues through TCSC8 until terminal 72 is discharged to +2 volts above ground potential at 0 level. As terminal 72 discharges, the capacitive coupling of the source to gate TCSC8 to via TCSC7 turns TCSC8 on hard which rapidly discharges terminal 72. When the X input returns to a 1 level TCSC5 is enabled and terminal 72 is returned in potential to the 0 level.

Figure 10:
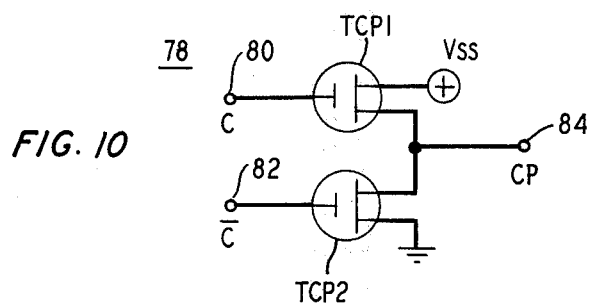
FIG. 10 illustrates an embodiment of a CP generator circuit which may be used as part of the memory system of FIGS. 1A and 1B.

Referring now to FIG. 10 there is illustrated the preferred embodiment of a CP generator circuit 73 which comprises transistors TCP1 and TCP2. The drain of TCP1 and the source of TCP2 are common terminal 84 which is the output terminal, is coupled to the drain of TCP1. A $\overline{C}$ input signal is coupled to terminal 80 which is coupled to the gate of TCP1. A C input signal is coupled to terminal 82 which is coupled to the gate of TCP2. The source of TCP1 is coupled to power supply +V$ss$ and the drain of TCP2 is coupled to ground potential.

Initially the C input signal is a 0 and $\overline{C}$ is a 1. This enables TCP2 and disables TXP1. Output terminal 84 is thereby charged to +1 V$t$ above ground potential. This CP output signal is coupled to the gates of TBR1A3–32A3 and TBR1B3–32B3 of FIGS. 5A and 5B. This signal enables TBR1A3–32A3 and TBR1B3–32B3 and thereby causes BR1A–32A and BR1B–32 to be set to +2V$t$ above ground potential.

$\overline{C}$ then goes to a 0 level and C goes to a 1 level. This enables TCP1 and disables TCP2. Terminal 84 now goes to +V$ss$, a 0 level. This 0 CP signal disables TBR1A3–32A3 and TBR1B3–32B3 and thereby allows BR1A–32A and BR1B–32B to float at +2V$t$ above ground potential until there is a readout signal from memory cell 16 on to one of the BRs.

Figure 11:
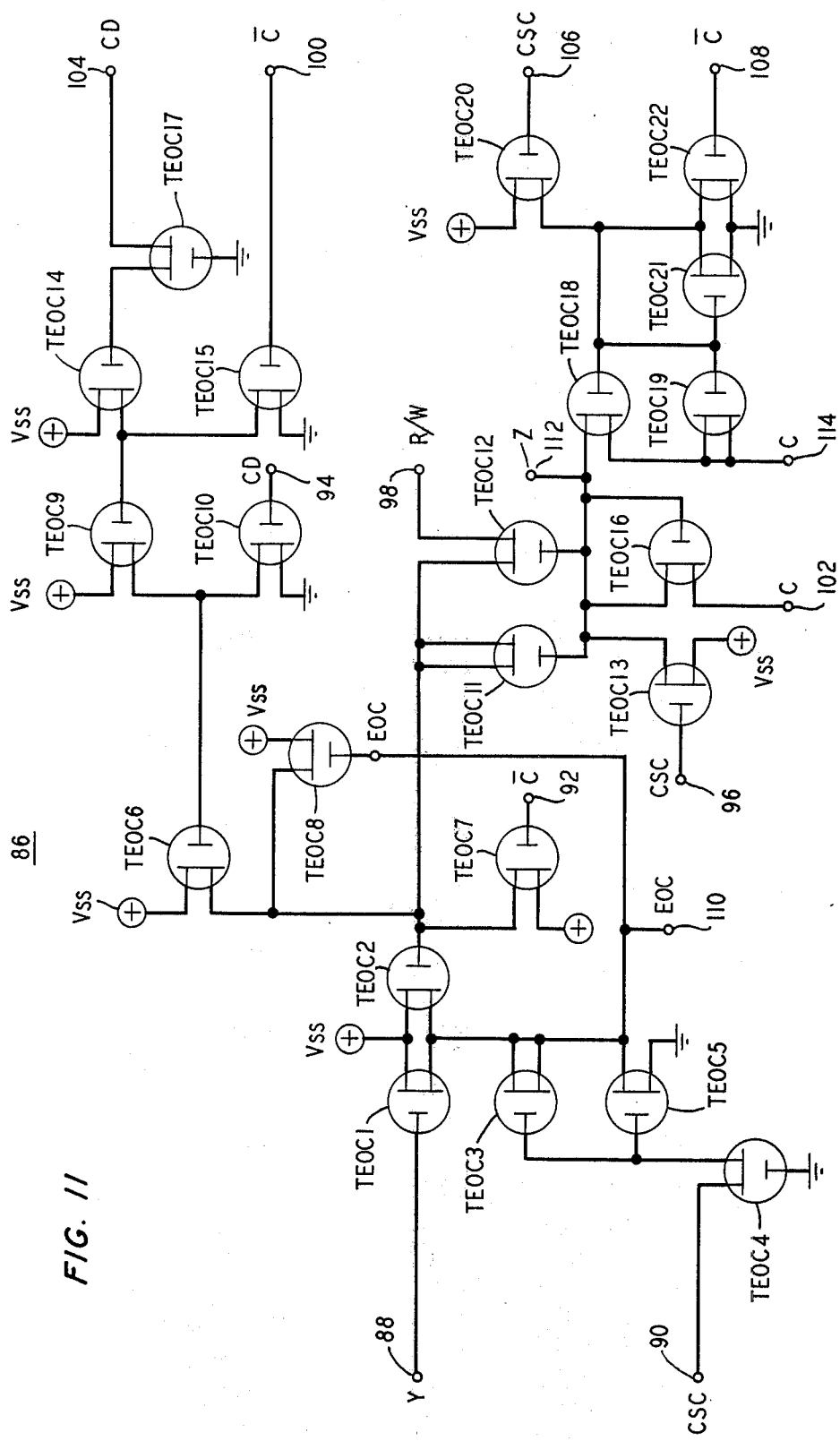
FIG. 11 illustrates an embodiment of an EOC and Z generator circuit which may be used as part of the memory system of FIGS. 1A and 1B.

Now referring to FIG. 11, there is illustrated a preferred embodiment of a EOC and Z generator circuit 86. Circuit 86 comprises 22 transistors TEOC1–22 which are interconnected as is illustrated. The Y terminal of FIGS. 5A and B is coupled to terminal 88 and CSC is coupled to terminals 90, 96 and 106. Signal CD, is coupled to terminals 94 and 104. $\overline{C}$ is coupled to terminals 92, 100 and 108. C is coupled to terminals 102 and 114. An external input signal R/W is coupled to terminal 98 which is coupled to the drain of TEOC12. The EOC output signal occurs at terminal 110 which is coupled to the gate of TEOC8 and to the source of TEOC5. The sources of TEOC1, TEOC2, TEOC6, TEOC7, TEOC8, TEOC9, TEOC13, TEOC14 and TEOC20 are all coupled to power supply +V$ss$ which is typically +16 volts. The Z output occurs at terminal 112 which is coupled to the drain and gate of TEOC16. The gates of TEOC4 and 17, and the drains of TEOC5, TEOC10, TEOC15, TEOC21 and TEOC22, are all coupled to ground potential. TEOC3, TEOC11 and TEOC19 all have the respective drains and sources connected together and are used essentially as voltage variable capacitors. TEOC16 and TEOC21 have the respective gates connected to the drains and are used essentially as diodes.

Assuming first a read/refresh cycle is desired and it is not desired to write any new information into a memory cell 16 of FIGS. 1A and 1B.

Initially, C is a 0 and $\overline{C}$ is a 1, Y is a +1V$t$ above ground potential and CSC is at a 0. R/W is held at a 0 throughout this cycle. It is however only necessary to hold R/W at a 0 for a short time prior to the time CSC is switched to a 1. CD is held at a 0 throughout this read only cycle. With the above combination of input signals, the EOC output is at a 0. This is because TEOC5 is disabled because its gate is at +16 volts due to the fact that TEOC4 is enabled and CSC is at a 0. In addition, TEOC1 is enabled and therefore terminal 110, the EOC output terminal, is charged to +V$ss$, a 0. The switching of C and $\overline{C}$ to a 1 and 0 respectively, has no effect on the EOC output signal which is at this time determined by X and CSC which have not yet changed levels.

Initially, terminal 112, the Z output, is at +16 volts. This is because TEOC22 is enabled since $\overline{C}$ is a 1 and therefore the gate of TEOC18 is at +1V$t$ above ground potential which enables TEOC18. Since C is at a 0, terminal 112 is changed to a 0 due to conduction through enabled TEOC18. When C and $\overline{C}$ switch to a 1 and a 0, respectively, terminal 112 switches to a 1. This occurs because TEOC22 becomes disabled and allows the gate of TEOC18 to float at +1V$t$. The negative polarity voltage pulse C applied to terminal 114 causes TEOC18 to conduct and allows terminal 112 to discharge to ground potential. The capacitive effect of TEOC19 allows the potential of the gate of TEOC18 to go negative and thereby allows terminal 112 to go to ground potential. TEOC21, which is connected as a diode prevents the potential of the gate of TEOC18 from going more negative than −1V$t$ below ground potential.

There is no change in the EOC output signal until the Y input signal switches to a 0 level. It is to be noted that CSC switches to a 1 level prior to y switching to a 0 level. The switching of CSC to a 1 enables TEOC5 and since TEOC1 is still enabled, current flows through TEOC1 and TEOC5. Due to the relative physical sizes of TEOC1 and TEOC5, the potential of terminal 110 is held at close to +16 volts. At this point in time TEOC3 is enabled and therefore has a significantly greater capacitance than previously when it was disabled (i.e., the gate was at +16 volts).

Now the Y input signal goes to a 0. This disables TEOC1. TEOC2 is also disabled at this point because the R/W input signal at terminal 112 was at a 0 level prior to CSC going to a 1. Now terminal 110 can discharge into TEOC5 and the potential thereby drops to 0 volts. The capacitance of enabled TEOC3 allows TEOC5 to conduct heavily and terminal 110 to go to ground potential, since the gate of TEOC5 can and does go negative in potential.

The Y input has no effect on the Z output at terminal 112. The CSC input to terminals 96 and 106 does control the Z output at times. When CSC goes from a 0 to a 1 the Z output goes to a 0. It stays there through the rest of the read cycle.

The returning of $\overline{C}$ to a 1 causes terminal Y to go from a 0 to a 1. This 1 Y input signal causes the EOC output signal of terminal 110 to go to the 0 level.

Assuming now that in addition to reading out information stored in a selected memory cell 16, it is also desired to write new information into the selected cell, the following procedure is used.

The same conditions initially present during a read only cycle are present now with two exceptions. The first is that prior to CSC going from a 0 to a 1 the R/W input to terminal 98 goes from a 0 to a 1. After CSC goes from a 0 to a 1 the R/W input signal can be a 1 or a 0. Typically, it stays a 1 until after CSC goes to a 1 and then is switched to a 0. During the read only cycle, EOC goes to a 1 after the input signal to terminal 88 goes to a 0. The R/W input signal to terminal 98 causes the gate of TEOC2 to be biased to ground potential and thereby enables TEOC2. This allows conduction through TEOC2 and TEOC5 which holds the potential of terminal 110 at approximately +16 volts. This is because the physical size of TEOC2 is much greater than that of TEOC5. Therefore the EOC output signal remains at a 0.

The second difference is that the CD input signal to terminals 94 and 104 goes from a 0 to a 1 just after Y and Z go to 0's. This CD 0 input signal causes the following. The gate of TEOC14 is switched to a 1 enabling TEOC14. Therefore, the gate of TEOC9 is brought up to +16 volts which disables TEOC9. The gate of TEOC10 is enabled and therefore the gate of TEOC6 receives a 1 input which enables TEOC6. This in turn charges the gate of TEOC2 to +16 volts which disables TEOC2. This in turn cuts off conduction through TEOC2 and thereby allows terminal 110 to discharge into enabled TEOC5 and thereby allows the output EOC signal to assume a 1. The purpose of TEOC8 is to hold TEOC2 disabled as the output EOC signal goes to a 1. This helps to readily cut off conduction in TEOC2 and enables the EOC output signal to more rapidly drop to the 1 level.

The CD input signal goes to 0 prior to the C signal returning to a 1. The return of the EOC output signal to a 0 is basically accomplished as in the read cycle by the $\overline{C}$ returning to a 1.

Figure 12:
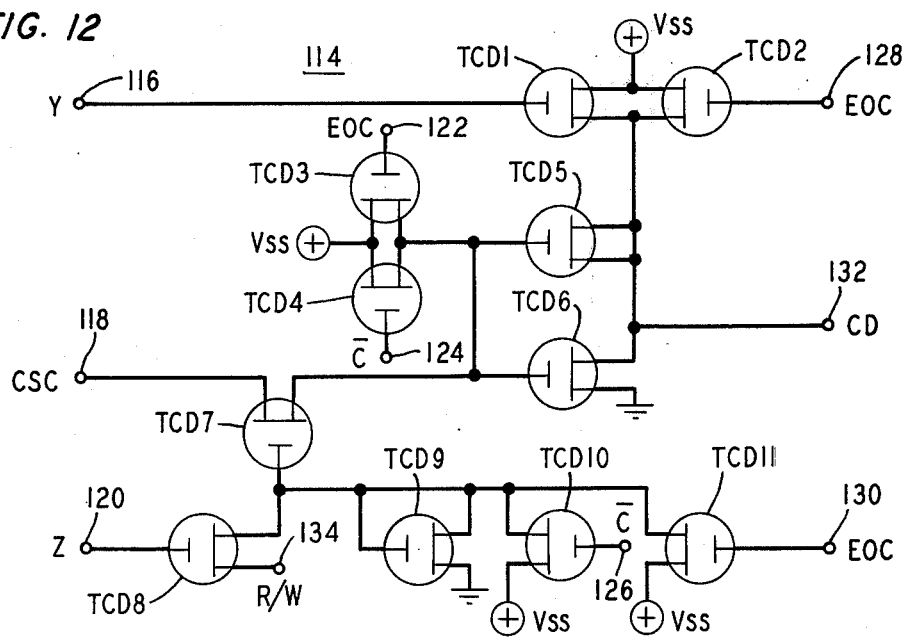
FIG. 12 illustrates an embodiment of a CD generator circuit which may be used as part of the memory system of FIGS. 1A and 1B.

Now referring to FIG. 12, there is illustrated the preferred embodiment of the CD generator 114 which comprises 11 transistors TCD1–11 which are interconnected as is illustrated. A Y input signal from terminal Y of FIGS. 1A and 1B is coupled to a terminal 116 which is coupled to the gate of TCD1. The EOC signal is coupled to terminal 122, 128 and 130. Terminals 122, 128 and 130 are coupled to the gates of TCD3, TCD2 and TCD11, respectively. The $\overline{C}$ signal is coupled to terminals 124 and 126, which are respectively coupled to the gates of TCD4 and TCD10. The CSC signal is coupled to terminal 118 which is coupled to the drain of TCD7. The Z signal is coupled to a terminal 120 which is coupled to the gate of TCD8. The R/W input signal is coupled to a terminal 134 which is coupled to the source of TCD8. Power supply +Vss is coupled to the sources of TCD1, TCD2, TCD3, TCD4, TCD10 and TCD11. Ground potential is coupled to the drain of TCD6 and the source of TCD9. Terminal 132, which serves as the output CD output terminal, is coupled to the source of TCD6.

During a read only cycle, CD is required to stay at a 0. This is accomplished because TCD6 is never enabled during a read only cycle and the potential of terminal 132 is either held at +Vss, a 0, because TCD1 or TCD2 are enabled or because the potential of terminal 132 floats at a 0 level even if TCD1 and TCD2 are disabled, since there is no path to discharge into.

Now assuming that it is desired to write new information into the selected memory cell 16 after read out. The R/W input signal is pulsed from a normal 0 to a 1 prior to the time CSC goes from a 0 to a 1 as was discussed previously. Initially the CD output (terminal 132) is at a 0 for the same reasons stated above for the read only cycle. The Z input to terminal 120 enables TCD8 which in turn couples the R/W 1 input to terminal 134 to the gate of TCD7. Previously during the read out only cycle the Z signal enabled TCD8 but the R/W input was always a 0 and therefore TCD7 was always disabled. The CSC signal goes from a 0 to a 1 prior to the time that Y goes from a 1 to a 0. This causes the gate of TCD6 to receive a signal prior to TCD1 being disabled. This means that TCD5 is enabled and acts as a relatively large capacitance which couples the source and drain of TCD6. When TCD1 is disabled the +16 volts on terminal 132 discharges into TCO6 and the drop in potential of the source of TDC6 is coupled to the gate of TCD8 such that TCD6 conducts heavily and thereby rapidly discharges terminal 132 to 0 volts. After a preselected delay the switching of output signal CD from +16 volts to ground potential causes the output of the EOC and Z generator circuit 86 to be switched from a 0 to a 1.

The EOC signal, which has been set to a 1 by the CD output signal (an input to circuit 86), causes the output of CD generator circuit 114 to switch back to a 0 level. The only time in which there is any DC flow of current in circuit 114 is during the short period when Y is at a 1 and CSC is also at a 1. During all other times there is no steady state DC power consummed.

Figure 13:
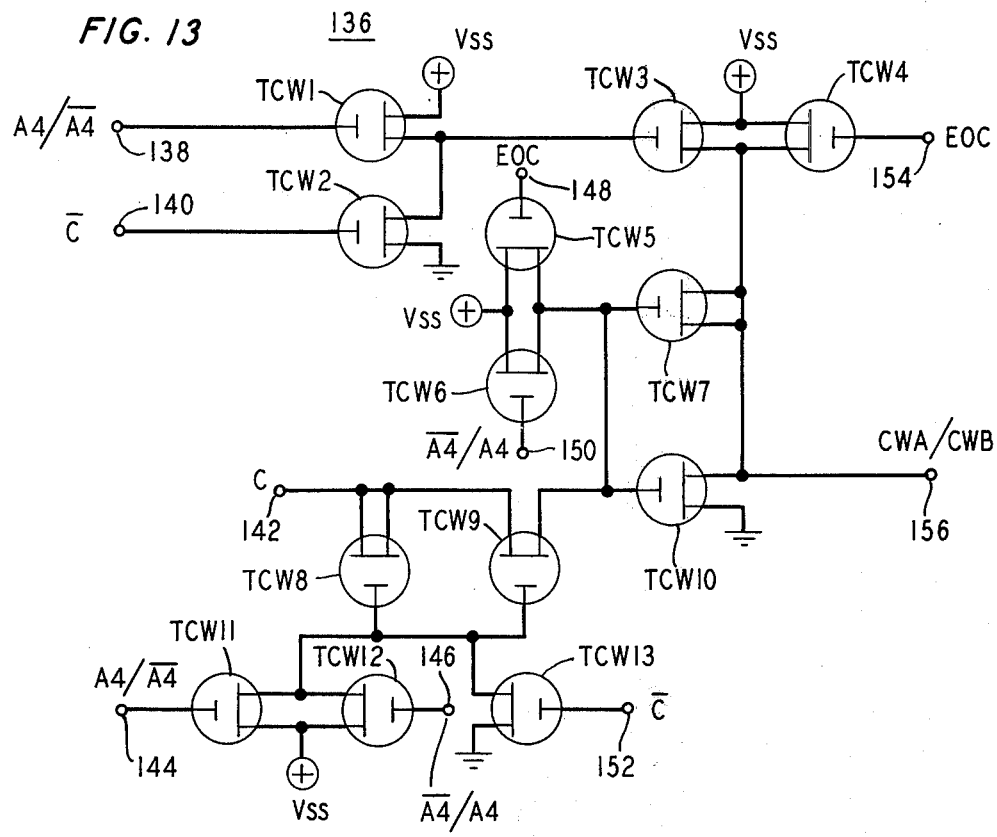
FIG. 13 illustrates an embodiment of a CWA/CWB generator circuit which may be used as part of the memory system of FIGS. 1A and 1B.

Now referring to FIG. 13 there is illustrated a preferred embodiment of the CWA/CWB generator circuit 136, which comprises transistors TCW1–13 that are interconnected as is illustrated. Terminal 138 is coupled to the gate of TCW1, the $\overline{C}$ signal is coupled to terminal 140 which is coupled to the gate of TCW2 and is coupled to the terminal 152 which is coupled to the gate of TCW13. The C input signal is coupled to terminal 142 which is coupled to the drain and source of TCW8. Terminal 144 is coupled to the gate of TCW11. Terminal 146 is coupled to the gate of TCW12. The EOC signal is coupled to terminal 154 which is coupled to the gate of TCW4. It is also coupled to terminal 148 which is coupled to the gate of TCW5. The sources of TCW1, TCW3, TCW4, TCW5, TCW6, TCW11, and TCW12 are all coupled to power supply +Vss. The drains of TCW2, TCW10, and TCW13, are all coupled to ground potential. Terminal 156, which serves of the output terminal, is coupled to the source of TCW10. To obtain the CWA output at terminal 156, it is necessary to apply input signal A4 to terminal 138, $\overline{A4}$ to terminal 150, A4 to terminal 144, and $\overline{A4}$ to terminal 146. To obtain the CWB output at terminal 156, it is necessary to apply $\overline{A4}$ to terminal 138 and 144, and A4 to terminals 146 and 150. Initially C is a 0 and $\overline{C}$ is a 1. A4 and $\overline{A4}$ are both 0's at this time because of the previously discussed characteristics of the address buffer inverter circuit 42. The EOC signal is also at a 0 level. These conditions cause TCW13 to be enabled and the gate of TCW9 to be charged to +1V$t$. TCW9 is therefore enabled and the gate of TCW10 is charged to a 0. TCW8, which is connected as a capacitor, is enabled. Now C is pulsed to a 1 and $\overline{C}$ is pulsed to a 0. The initial effect on the gate of TCW9, which is at +1V$t$, is to follow the C input which is dropping. This causes TCW9 to conduct heavily and thereby discharges the gate of TCW10 to 0 volts. The A4 input signal to terminal 144 goes to a 1 thereby enabling TCW11 which caused the gate of TCW9 to then charge up to +Vss. This charging of the gate of TCW9 to +Vss disables TCW9 and leaves a 1 (0 volts) trapped on the gate of TCW10. This 1 also enables TCW7, which is connected as a capacitor, $\overline{C}$ was initially at a 1. This enables TCW2 (TCW1 is disabled because A4 and $\overline{A4}$ are both at +Vss at this time) which causes the gate of TCW3 to be enabled. This causes terminal 156 to be charged to +V55 (typically +16 volts). There is at this point in time conduction through TCW3 and TCW10. The relative physical size of TCW3 and TCW10 is such that the potential of terminal 156 is at abpproximately +16 volts. Now when $\overline{C}$ goes to a 0 and thereby disables TCW2. The gate of TCW3 floats in potential at +1Vt until input signal A4 goes to a 1 and thereby enables TCW1 which causes the gate of TCW3 to go to +Vss. This disables TCW3 and therefore allows terminal 156 to discharge into TCW10 to a 1 (0 volts). The capacitive coupling of TCW 7 is well understood at this point and will not be discussed. When the EOC input signal to terminals 148 and 154 goes to a 1 then TCW4 and TCW5 are enabled and output terminal 156 is charged from a 1 (0 volts) to a 0 (+16 volts). The gate of TCW10 is returned to +Vss. This disables TWC10.

At the time the memory cell of array A of FIG. 1A and 1B is selected CWA must be pulsed to a 1 from the normal 0. In order to insure that no information is read out of any of the memory cells 16 of array B it is necessary that CWB remain at the 0 through the entire cycle. As has been discussed the CWB output at terminal 156 is obtained by applying A4 to terminal 138 and A4 to terminal 150. Like when the CWA output signal is created the potential of the gate of TCW10 is set to 0 volts and the potential of terminal 156 is set to +16 volts. The $\overline{A4}$ signal leaves TCW3 enabled therefore terminal 156 remains at a 0 (+16 volts). The A4 signal to the gate of TCW6 enables TCW6 and thereby causes the gate of TCW10 to charge to +Vss. This disables TCW10 and therefore keeps power dissipation relatively low.

The readout of information from the selected memory cell 16 and the refreshing of the information stored therein has now been completed and it is time to reset the system to the initial conditions. The Y terminal is set from a 1 to a 0 after WW1A goes to a 0 to enable refresh. The Y terminal serves as an input to an EOC (end of cycle) and Z generator circuit 86. The change of the potential of the Y terminal from a 1 to a 0 causes the EOC output to go from a 0 to a 1. This change in the EOC signal is coupled to the CWA/CWB generator circuit 136 of FIG. 13, and the $\overline{C}$ generator circuit 50 of FIG. 7 (or the $\overline{C}$ generator circuit 152 of FIG. 14,) and the CAS/CSB generator circuit of FIG. 8. When the EOC signal goes from a 0 to a 1 the CWA output of the CWA/CWB generator circuit of FIG. 13 is pulsed from a 1 back to a 0, the initial condition. The CWB output of the CWA/CWB generator circuit of FIG. 13 is maintained at a 0 throughout the entire read cycle. The returning of CWA to a 0 resets WR1A to a 0 (typically +16 volts). The pulsing of the EOC signal to 1 also causes the CSA output of CSA/CSB generator circuit 56 of FIG. 8 to be pulsed from a 1 to a 0. This causes WW1A to be returned to the initial 0 potential (+16 volts) all other WWs are at a 0 potential and remain there. When the $\overline{C}$ signal returns from a 0 to a 1 and BW1-32 are all returned to the initial condition of +1Vt above ground potential. The output of CP generator circuit 78 of FIG. 10 is pulsed to +1Vt above ground potential. This enables TBR1A3–32A3 and TBR1B3–32B3. It also enables TLX which reset terminal X to the initial value of +2Vt above ground potential and BR13–32 to all return to the initial +2Vt above ground potential and the $\overline{C}$ signal also serves an an input to EOC and Z generator circuit 86. When $\overline{C}$ goes from the 0 level to the 1 level the EOC output is pulsed back to the initial 0 level. Another cycle can now begin. $\overline{C}$ also resets all ASLs and DSLs as well as all other control circuits.

Figure 14:
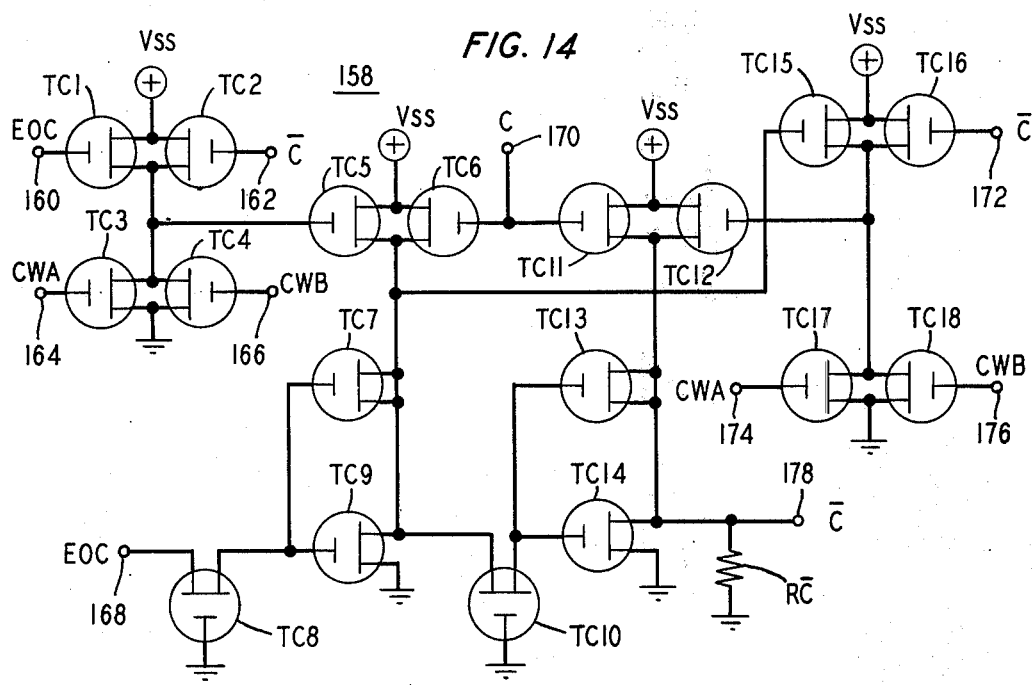
FIG. 14 illustrates another embodiment of a clock inverter circuit which may be used with the memory system of FIGS. 1A and 1B.

Referring now to FIG. 14 there is illustrated the preferred embodiment of a $\overline{C}$ generator circuit 158 which comprises eighteen transistors TC1–18 that are interconnected as is illustrated. The drains of TC3, 4, 9, 14, 17, and 18 are all coupled to ground potential. The gates of TC8 and TC10 are also coupled to ground potential. The sources of TC1, 2, 5, 6, 11, 12, 15, and 16 are coupled to +Vss. The EOC signal is coupled to terminal 160 and 168 which are coupled to the gates of TC1 and the source of TC8, respectively. Terminal 178, which is coupled to the source of TC14 and $\overline{RC}$, serves as the $\overline{C}$ output signal terminal. The $\overline{C}$ output signal appearing at terminal 178 is coupled to terminals 162 and 172. Terminals 162 and 172 are coupled to the gates of TC2 and TC16, respectively. The C input signal is coupled to terminal 170 which is coupled to the gates of TC6 and TC11. The CWA input signal is coupled to terminals 164 and 174 which are coupled to the gates of TC3 and TC17, respectively. Input CWB is coupled to terminal 166 and 176 which are coupled to the gates of TC4 and TC18, respectively.

Initially, C is a 0 and $\overline{C}$ is a 1. CWA, CWB and EOC are 0's. When C switches to a 1, terminal 178, the $\overline{C}$ output terminal, switches to a 0. Current flows through TC11 and $\overline{RC}$. This is because TC11 is enabled as the gate of TC11 is coupled to the terminal 170, the C input terminal. In addition, TC6 is also enabled and therefore causes the gate of TC15 to switch to +Vss, a 0. This disables TC15. TC14 is also disabled because the gate of TC14 is coupled via an enabled TC10 to the gate of TC15.

A predetermined time later, CWA or CWB switches from a 0 to a 1. TC5 and TC12 are enabled this time because the potential on the respective gates is discharged to 1Vt above ground. Since terminal 178 is alread at +Vss this time the potential of terminal 178 remains at a 0. When EOC switches from a 0 to a 1, TC9 is enabled because the gate of TC9 is coupled to the terminal 168 via an enabled TC8. The EOC input signal is also coupled to terminal 160 and enables TC1 which charges the gate of TC5 to +Vss, a 0. This disables TC5. At this time both CWA and CWB have returned to 0 if they were 1's. Therefore TC3, TC4, TC17 and TC18 are disabled. Current flows through TC6 and TC9. Due to the relative physical size of TC6 and TC9, the potential on the gate of TC10 is held at close to +16v. At this point in time, TC7, which is connected as a capacitor, is enabled and therefore has a significantly greater capacitance than previously when it was disabled.

Now the C input signal goes to a 0. This disables TC6 and TC11. Now the gate of TC15 can discharge into TC9 and the potential thereby drops to 0 volts. The capacitive effect of enabled TC7 allows TC9 to conduct heavily and the gate of TC15 to go to ground potential. TC14 is also enabled at this time. This is because the gate of TC14 is coupled to gate of TC15 via an enabled TC10. Current flows through TC12 and TC14. Due to the relative physical size of TC12 and TC14, the potential of terminal 178 is held at close to +V$ss$, a 0. At this point in time TC13 is also enabled and has greater capacitance than when it was disabled.

The enabled TC15 charges the gate of TC12 to +V$ss$ and therefore disables TC12. Now terminal 178 can discharge into TC14 and the potential thereby drops to 0 volts. The capacitive effect of enabled TC13 allows TC14 to conduct heavily and terminal 178 to go to ground potential since the gate of TC14 can and does go negative in potential. The return of $\overline{C}$ to a 1 starts the entire memory cycle.

Now referring to FIGS. 15A and 15B there is graphically illustrated the C(clock) input signal, the R/W input signal, and all resulting signals as a function of time. It is assumed that information input signals A0–A9 have been applied to the appropriate inputs of 10 before the C goes from the initial 0 state to the 1 state. The waveforms of FIG. 15A illustrate a read only cycle of the memory 10 of FIGS. 1A and 1B. The waveforms of FIG. 15B illustrate a read/write cycle of memory 10 of FIGS. 1A and 1B.

Figure 16:
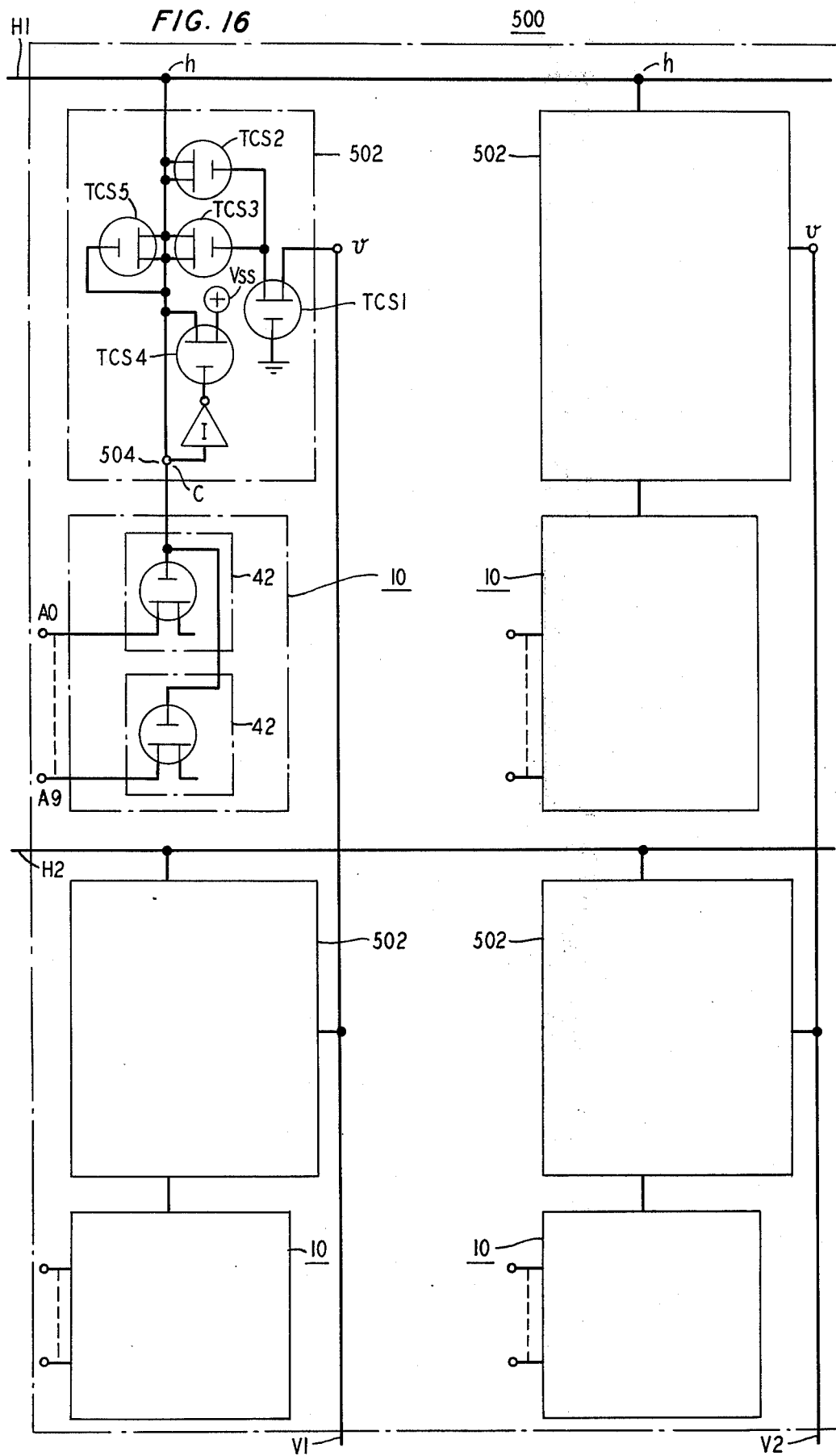
FIG. 16 illustrates a memory plane which utilizes multiple memory systems of the kind illustrated in FIGS. 1A and 1B.

Now referring to FIG. 16, there is illustrated a two by two memory plane 500 which comprises four array memory systems 10 array which are arranged into two rows and two columns. Each system 10 receives input signals A0-A9. All A0 inputs of the four systems 10 are coupled together. The same is true for all A1–A9 inputs. The C output terminal 504 of separate Chip Select Circuit 502 is coupled to the C inputs of address buffer inverter circuits 42. The Chip Select Circuits 502 each have an $h$ and $v$ input terminals. The $h$ inputs of the two Chip Select Circuits 502 of the first row are coupled together to terminal H1. The two $h$ inputs of the Chip Select Circuits 502 of the second row are coupled to terminal H2. The two $v$ inputs of Circuits 502 of the first column are coupled together to terminal V1. The two $v$ inputs of the Circuits 502 of the second column are coupled together to terminal V2.

Circuit 502 comprises five transistor TCS1–5. The $h$ input terminal is coupled to the sources of TCS3 and TCS5. The $v$ input terminal is coupled to the source of TCS1. The gate and drain of TCS1 are coupled to ground potential and the gate of TCS2, respectively. The gate, drain, and source of TCS3 are coupled to the gate of TCS2, the drain of TCS5 and the source of TCS5, respectively. The drain and source of TCS2 are coupled together to the sources of TCS3 and TCS5. TCS2 is therefore connected as a capacitor which couples the sources of TCS5 and TCS3 to the gate of TCS3. The gate of TCS5 is coupled to the drain of TCS5, the drain of TCS4 and C output terminal 504. The drain of TCS4 is coupled to terminal 504. Terminal 504 is coupled through an inverter I to the gate of TCS4. The source of TCS4 is coupled to +V$ss$.

The C output 504 of 502 is activated only if the corresponding $h$ and $v$ inputs are both 1's (typically 0 volts). The A0–A9 input signals to the four 10s are applied at the same time as a address signals are applied to V1 and V2. A short period of the latter address signals are applied to H1 and H2. If it is desired to active the 502 circuit located at (H1, V1) then H1 and V1 are both 1's. Initially, all H and Vs are 0's. First the V1 signal is applied first to TCS1, which is enabled.

This causes the gates of TCS3 and TCS2 to go to +1V$t$ above ground potential. This enables TCS3 and TCS2. Now H1 switches to a 1 from a 0. This change in potential at the source of TCS3 is coupled to the gate at TCS3 and thereby the gate of TCS3 drops below ground potential thus enabling TCS3. This causes terminal 504 to switch to a 0 level from the normal 1 level.

The 1 output at terminal 504 is inverted by inverter I and disables TCS4. This allows terminal 504 to stay at a 1. Normally to return terminal 504 to a 0, $h$ is first pulsed to a 0 and then $v$ is pulsed to a 0. If for some reason $v$ is pulsed first terminal 504 would not return to a 0 but for TCS5, (connected as a diode,) which forces the return to a 0. The 1 level applied to 10 which is located at (H1, V1) enables the transistor coupled to the C input of the Address Buffer Inventor Circuits 42. This permits input signal A0–A9 to be applied to the A and B memory arrays of 10 located at (H1, V1).

It is significant to note that when an address buffer inverter circuit receives a 1 C input signal the capacitive loading on driver circuits (not illustrated) which provide input signals A0–A9 is considerably increased from that which exists prior thereto. Therefore, the capacitive loading on the A0 driver circuitry (not illustrated) is much lower when the input C transistor is disabled than when it is enabled. Since A0–A9 are coupled to all four circuits 10 and only one of the four is activated, the capacitiive loading on the A0–A9 input signal is kept relatively low. This is to be contrasted with prior art memory systems in which all inputs are wired directly to the means which activate the memory cells. This means that even though only one of the memory arrays is activated at a time that the full or nearly the full input capacitive of all the memory arrays is loaded on each input driver circuit. This causes a loss in system speed or the power consumed by the input drivers must be increased to maintain the same speed as in this present invention.

Figure 17A:
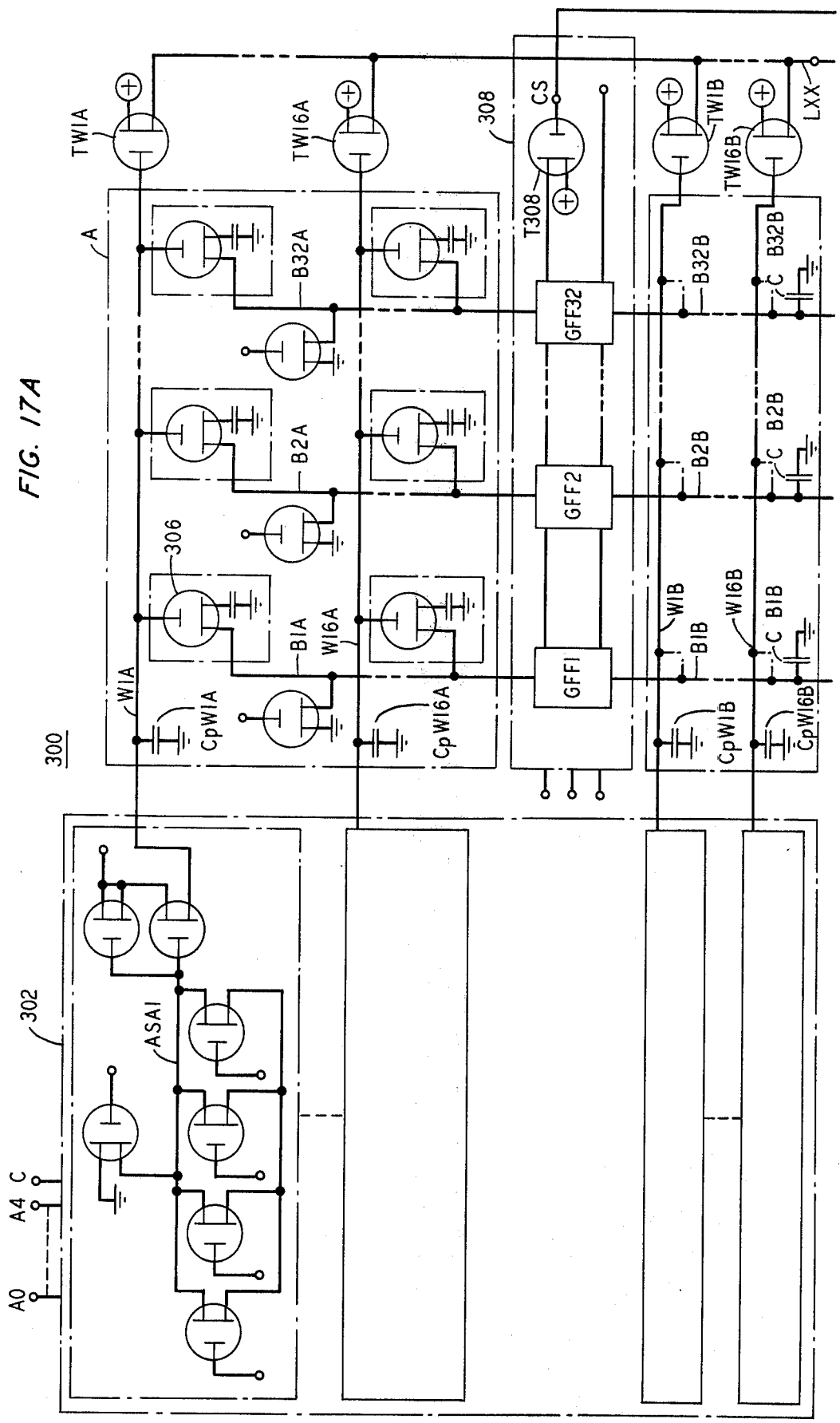
FIGS. 17A and 17B illustrate in schematic and block diagram form an embodiment of another memory system in accordance with this invention.
Figure 17B:
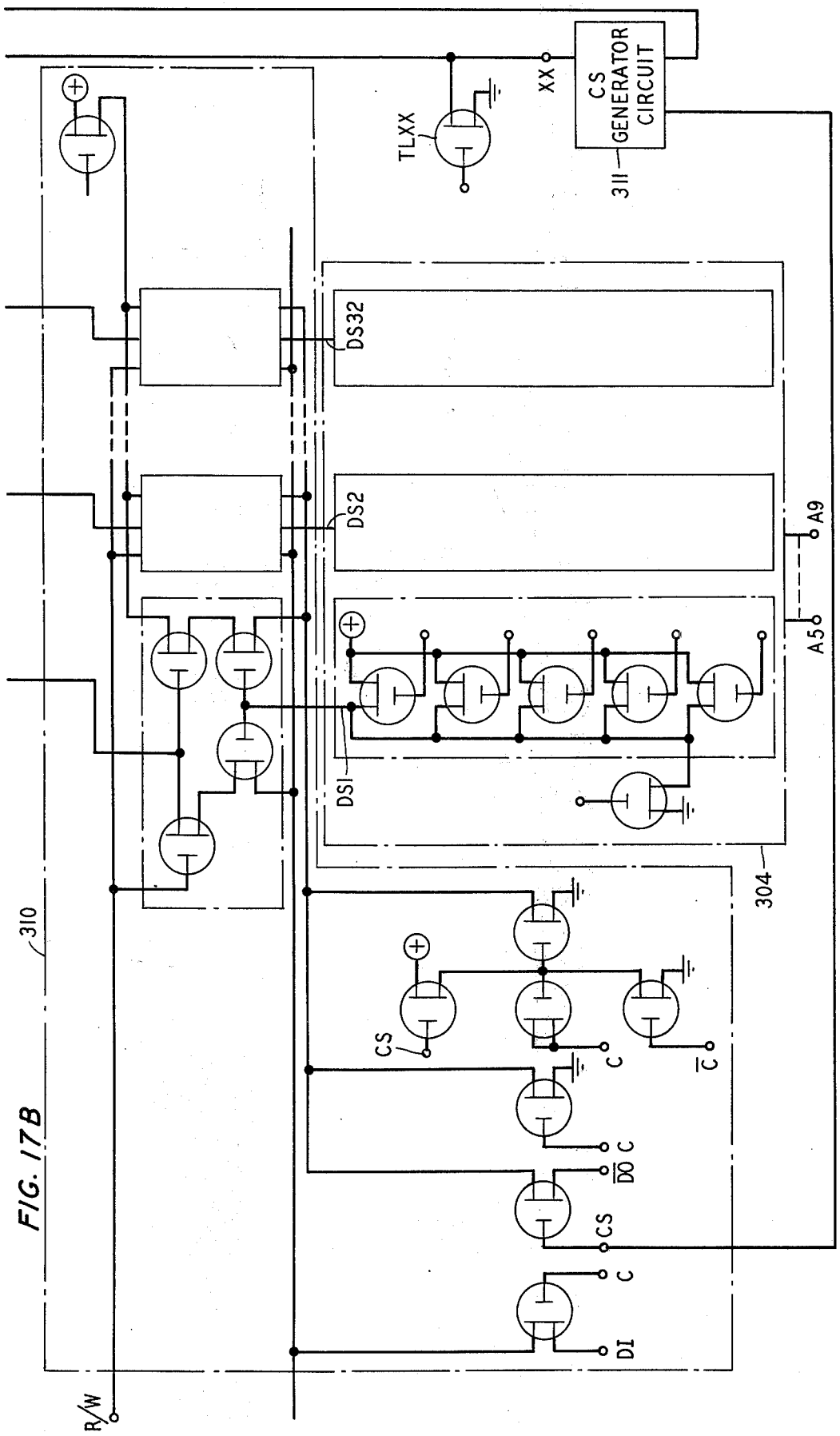

Now referring to FIG. 17A and 17B there is illustrated a semiconductor memory array system 300 comprising horizontal address circuits 302, vertical address circuits 304; an A array of memory cells 306, a B array of memory cells 306, read/write/rewrite circuits 308, and input/output circuits 310.

The memory cells 306 of array A and array B are arranged in rows and columns. There is one row and one column coupled to each of the memory cells 306. The rows coupled to the memory cells of array A are denoted as word lines W1A–16A. The columns of array A, are denoted as B1A–32A. Likewise the rows and columns of array B are denoted as W1B–16B and B1B–32B. B1A–32A and B1B–32B are coupled to the read/write/rewrite circuitry 308. In addition B1B–32B are coupled to input/output circuits 310. W1A–16A and W1B–16B are coupled to horizontal address circuitry 302. The vertical address circuitry 304 is coupled to the input/output circuitry 310 via data select lines DS1–32. Each of W1A–16A, W1B–16B, B1A–32A, and B1B–32B, has a separate parasitic capacitance associated with it. The capacitance denoted as CpW1A is that capacitance associated with W1A; that denoted as CpB1B is that associated with B1B; etc.

Input terminals A0, A1, A2, A3, and A4 and C, are connected to horizontal address circuitry 302. Input terminals A5, A6, A7, A8 and A9, are connected to vertical address circuitry 304.

W1A–16A are coupled to the gates of transistors TW1A–16A, respectively. W1B–16B are coupled to the gates of transistors TW1B–16, respectively. The sources of TW1A–16A, and TW1B–16B, are all coupled to power supply +V$ss$. The drains of TW1A–16A and TW1B–16B are coupled to a common line LXX. The drain of a transistor TLXX is coupled to line LXX. A terminal XX is also coupled to LXX.

The memory cell 306 comprises a field effect transistor with a capacitor Cs coupled to the source. The gate of each of the IGFETs of each momory is coupled to a W and the drain is coupled to a B. The basic schematic and storage made of the memory cell 306 is well known and is described among other places in a copending U.S. patent application Ser. No. 312,182 filed Dec. 4, 1972.

The internal structure the horizontal vertical address circuitry 302 is identical to that of the horizontal address circuit 12 with the exception that T1A8–T16A8, T1B8–T16B8 and RWW1A–16A and RWW1B–16B and all WWs are eliminated. The horizontal address circuitry 302 permits 1 out of 16 of ASA and 1 out of 16 of ASBs to be selected. The vertical address circuitry 304 permits 1 out of 32 DSs to be selected. These circuits operate essentially the same as the earlier horizontal and vertical described circuits of FIGS. 1A and 1B with the exception that the is only one horizontal control line (W) per row of memory cells 306 and only one vertical control line (B) per column of memory cells 306. The DSs of 304, which correspond to the DSL lines of the vertical circuitry 14 of FIGS. 1A and 1B, are coupled to the input/output circuitry 310. Circuitry 310 has the identical R/W1–32 subcircuits of subcircuit 1 of FIG. 5B. In addition, it includes the equivalent of transistors TDO1-TDO6 and $\overline{TDO}$ and TDI. This input/output circuitry is therefore all but identical to the described subsections of the circuitry 18 of FIGS. 5A and 5B. The BH1B-32Bs are coupled to input/output circuitry 310 as is illustrated.

Read/write/rewrite circuitry 308 comprises 32 gated flip-flops GFF1-32, which are each controlled by a common CS signal applied to the gate of T308. The CS is created by CS generator circuit 311. The CS output of 311 is also coupled to the input-output circuitry 310 as illustrated. The drain and source of T308 are coupled to GFF1-32 and +V$ss$, respectively. When it is desired to read information out of a selected cell, for example, the first cell of W1A and B1, the W1A line is activated (set to a 1 potential) by the horizontal access circuitry 302. Depending on what information is stored within selected cell 306, the potential of B1A is set to a 1 or a 0. The gated flip-flop corresponding to B1A and B1B automatically sets the potential of B1B to a reference level which is midway between a 1 and a 0. The gated flip-flop GFF1 of circuit 308 detects the potential on line B1A corresponding to the selected cell 306 and causes the information signal received from the cell 306 amplified and to be rewritten into the cell 306 via B1A and to be impressed onto B1B, which is coupled through circuit 310 to the output terminal $\overline{DO}$.

In order to write new information into any selected cell of array A or array B, it is necessary to apply the input signal to the DI input of 310 and to activate the R/W input.

The basics types of control circuitry used in FIGS. 1A and 1B have been applied to the single transistor memory cell of FIG. 17A and 17B. Various modifications are possible and many of the details are left to those skilled in the art to work out.

A functional 1024-bit semiconductor memory system, like the one illustrated in FIGS. 1A and 1B, including the preferred embodiments of the control circuitry which is illustrated in FIGS. 6, 8, 9, 10, 11, 12, 13 and 14, has been fabricated on a single integrated circuit chip. The chip select circuitry of FIG. 16 is also included. This single integrated circuit chip has the physical dimensions of 140 mils by 115 mils. All the transistors are P-Channel IGFETs. A typical access time is 180 nanoseconds and a typical cycle time is 500 nanoseconds. Typical the power dissipation is 160 milliwatts. Sixty-four of these 1,024 bit memories have been coupled together to form a 64,000-bit memory plane.

The basic concept utilized in all the controlled circuitry described herein is to minimize power dissipation by powering up a circuit just before the time it is needed. In addition, synchronization of timing pulses has been made almost completely automatic since once initial conditions are set up all other conditions occur in the proper sequence because the appropriate circuitry is not enabled until a previous condition is established. Input control signals C, R/W and A4 serve to activate in the proper sequence all other control signals which are created on the chip.

It is to be understood that the embodiments described herein are merely illustrative of the general principles of the invention. Various modifications are possible within the spirit of the invention. For example, N-Channel IGFETs can be substituted for the P-Channel IGFETs providing all the appropriate voltages are adjusted. Still further, the basic circuits uitlized can easily be modified to accommodate a variety of dynamic memory cells other than the two specifically described.

What is claimed is:

1. A semiconductor memory system comprising:
    a first array of n-rows and m-columns of interconnected memory cells;
    a second array of n-rows and m-columns of interconnected memory cells;
    each of the memory cells comprises three field effect transistors, the drain of the first transistor being coupled to the gate of the second transistor, the drain of the second transistor being coupled to the source of the third transistor;
    a WR, WW, BR, and BW terminal being coupled to the gate of the third transistor, the gate of the first transistor, the drain of the third transistor, and the source of the first transistor, respectively;
    the WR terminal of each memory cell of a given row of memory cells being coupled to a WR line, the WW terminal of each memory cell of a given row of memory cells being coupled to a WW line, the BR terminal of each memory cell of a given column of memory cells being coupled to a BR line, the BW terminal of each memory cell of a given column of memory cells being coupled to a BW line;
    a first plurality of 2n field effect transistors, the gate of each of the 2n transistors of the first plurality being coupled to a separate one of the WW lines, the drains of the first plurality of 2n transistors being coupled together to a y terminal;
    a second plurality of 2n field effect transistors, the gate of each of the 2n transistors of the second plurality being coupled to a separate one of the WR lines, the drains of the second plurality of 2n transistors being coupled together to a terminal X;

the drain of a transistor TLX being coupled to terminal X;

the drain of a transistor TLY being coupled to terminal Y;

a plurality of first capacitors, a separate one of each of the first capacitors being coupled to a WW line;

plurality of second capacitors, a separate one of each of the second capacitors being coupled to a WR line;

a plurality of third capacitors, a separate one of each of the third capacitors being coupled to a BW line;

a plurality of fourth capacitors, a separate one of each of the fourth capacitors being coupled to a BR line;

all WR lines and WW lines being coupled to horizontal address circuitry which is adapted to select a WW and WR coupled to the same row of transistors of the first or second array and set the potential of the selected WR and WW to a different value than all other WRs and WWs;

read/write/rewrite circuitry comprising:

m-subcircuits, each of the m-subcircuits comprising four circuits $m1$, $m2$, $m3$, and $m4$, circuit $m1$ comprising:

first, second, third and fourth transistors T1A, T2A, T3A, and T4A, the gate of T1A and the drains of the T3 and T4 being coupled to a separate one of the BR lines of array A, the drain of T1 being coupled to the source of T2, the drain of T2 being coupled a separate one of the BW lines, circuit $m2$ comprising first, second, third and fourth transistors, T1B, T2B, T3B, and T4B, the gate of T1B and the drains of T3A and T4A being coupled to a separate one of the BR lines of array B;

$m3$ comprising a single transistor, the source of which is coupled to a separate one of the BW lines;

$m4$ comprising four transistors, T11, T12, T13, and T14, the gates of T11 and T14 being coupled together to a separate one of $m$-date select lines, the drain of T11 being coupled to a $\overline{DO}$ line, the source of T14 being coupled to a $\overline{DI}$ lines, the source of T11 being coupled to the drain of T12, the gate of T12 being coupled to a separate one of the BW lines and to the drain of T13, the source of T13 being coupled to the drain of T14;

the drain of a transistor TD1 being coupled to line DI, and the source of a transistor $T\overline{DO}$ being coupled to line $\overline{DO}$;

the $m$-data select lines being coupled to vertical address circuitry which is adapted to select one of the data selected lines and set the potential of the selected line at a different value than the nonselected lines.

2. The apparatus of claim 1 wherein the field effect transistors an n-channel insulated gate field effect transistors.

3. The apparatus of claim 2 wherein $n=16$ and $m=32$.

4. A semiconductor memory system comprising:

a first array of $n$-rows and $m$-columns of interconnected memory cells;

a second array of $n$-rows and $m$-columns of interconnected memory cells;

each of the memory cells having at least a first and a second terminal;

the first terminal of each memory cell of a given row of memory cells being coupled to a separate W line;

the second terminal of each memory cell of a given column of memory cells being coupled to a separate B line;

a plurality of first capacitors, a separate one of each of the first capacitors being coupled to a W line;

a plurality of second capacitors, a separate one of each of the first capacitors being coupled to a B line;

all of the W lines being coupled to horizontal address circuitry which is adapted to select a W line of the first or second array and set the potential of the selected W to a different value than all other W lines;

a plurality of $2n$ transistors, each of the transistors having a first, second and control terminal, the control terminal of each of the $2n$ transistors being coupled to a separate one of the W lines, all of the first terminals being coupled together to a terminal X;

a transistor T1 having a first, second and control terminal, the first terminal being coupled to terminal X;

a CS circuit having at least one input terminal and one output terminal;

the terminal X being coupled to an input terminal of CS;

the output terminal of CS being coupled to input/output circuits and read/write/rewrite circuits;

the columns of array A and B being coupled to the read/write/rewrite circuits;

the columns of array B being coupled to the input-/output circuits;

the input/output circuits being coupled to a plurality of $m$ data select lines; and the data select lines being coupled to vertical address circuitry which is adapted to select one of the data select lines and set the potential of the selected line to a different value than the non selected lines.

5. An address buffer inverter circuit comprising:

T1 through T9 field effect transistors;

the source of T1 being coupled to an input terminal, the drain of T1 being coupled to the drain of T6 and the gate of T2;

the source of T2 being coupled to the gates of T5 and T7 and the source of T3;

the drain of T4 being coupled to the drain and source of T5 and the source of T6;

the drain of T6 being coupled to the source of T7;

the source of T6 being coupled to the gate of T9;

a first output terminal being coupled to the drain of T1; and a second output terminal being coupled to the gate of T9.

6. The apparatus of claim 5 further comprising a tenth transistor T10, the gate and drain of T10 being coupled to the second output terminal and the first output terminal, respectively.

7. An inverter circuit comprising:

T1 through T7 field effect transistors;

an input terminal being coupled to the gates of T1 and T5;

the drain of T1 being coupled to the gates of T6 and T7 and the source of T2;

the drain of T5 being coupled to the drain and source of T6 and the source of T7;

a resistor being coupled to the drain of T5;

an output terminal being coupled to the drain of T5; and the gate of T2 being coupled to the drains of T3 and T4 and to the gate of T3.

8. An inverter circuit comprising:

T1 through T18 field effect transistors;

the sources of T1 and T2 being coupled together;

the drains of T1 and T2 being coupled together and being coupled to the sources of T3 and T4 and the gate of T5;

the drains of T3 and T4 being coupled together;

the sources of T5 and T6 being coupled together;

the drains of T5 and T6 being coupled together and being coupled to the drain and source of T7, the source of T9, and the gate of T15;

the gate of T7 being coupled to the gate of T9 and to the drain of T8;

the source of T9 being coupled to the drain of T10;

the source of T10 being coupled to the gates of T13 and T14;

the gates of T6 and T11 being coupled together;

the sources of T11 and T12 being coupled together;

the drains of T11 and T12 being coupled together and being coupled to the drain and source of T13 and the source of T14;

a resistor being coupled to the source of T14;

an output terminal being coupled to the source of T14;

the sources of T15 and T16 being coupled together;

the drains of T15 and T16 being coupled together and being coupled to the gate of T12 and to the sources of T17 and T18; and the drains of T17 and T18 being coupled together.

* * * * *